United States Patent
Moon et al.

(10) Patent No.: US 10,727,212 B2
(45) Date of Patent: Jul. 28, 2020

(54) SEMICONDUCTOR PACKAGE

(71) Applicant: SAMSUNG ELECTRONICS CO., LTD., Suwon-si (KR)

(72) Inventors: Seon Hee Moon, Suwon-si (KR); Myung Sam Kang, Suwon-si (KR); Young Gwan Ko, Suwon-si (KR); Chang Bae Lee, Suwon-si (KR); Jin Su Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 103 days.

(21) Appl. No.: 16/170,469

(22) Filed: Oct. 25, 2018

(65) Prior Publication Data
US 2019/0287953 A1 Sep. 19, 2019

(30) Foreign Application Priority Data

Mar. 15, 2018 (KR) .................. 10-2018-0030337
Jun. 19, 2018 (KR) .................. 10-2018-0070111

(51) Int. Cl.
*H01L 23/498* (2006.01)
*H01L 25/16* (2006.01)
(Continued)

(52) U.S. Cl.
CPC .......... *H01L 25/16* (2013.01); *H01L 21/4857* (2013.01); *H01L 21/52* (2013.01);
(Continued)

(58) Field of Classification Search
CPC ......... H01L 23/49838; H01L 23/49822; H01L 23/49827; H01L 23/49894; H01L 23/3135; H01L 23/3128
See application file for complete search history.

(56) References Cited

U.S. PATENT DOCUMENTS 9,865,566 B1  1/2018 Yu et al.
2004/0125579 A1  7/2004 Konishi et al.
(Continued)

FOREIGN PATENT DOCUMENTS

JP  2003-347741 A  12/2003
JP  2004-214258 A  7/2004
(Continued)

OTHER PUBLICATIONS

Office Action dated Jul. 18, 2019 by the Korean Intellectual Property Office in counterpart Korean Patent Application No. 10-2018-0070111.

(Continued)

*Primary Examiner* — Douglas M Menz
(74) *Attorney, Agent, or Firm* — Sughrue Mion, PLLC

(57) ABSTRACT

A semiconductor package includes a connection structure including a first insulation layer, a second insulation layer, first and second wiring layers, and first and second connection vias. A core structure including a core member is on the first insulation layer. A first through-hole passes through the core member. Passive components are on the first insulation layer in the first through-hole and connected to the first wiring layer through the first connection via. A first encapsulant covers at least a portion of the passive components. A second through-hole passes through the core structure and the first insulation layer. A semiconductor chip is on the second insulation layer in the second through-hole and is connected to the second wiring layer through the second connection via. A second encapsulant covers at least a portion of the semiconductor chip.

32 Claims, 23 Drawing Sheets

(51) Int. Cl.
*H01L 23/053* (2006.01)
*H01L 23/31* (2006.01)
*H01L 21/52* (2006.01)
*H01L 21/56* (2006.01)
*H01L 21/48* (2006.01)
*H01L 23/00* (2006.01)

(52) U.S. Cl.
CPC ............ *H01L 21/56* (2013.01); *H01L 23/053* (2013.01); *H01L 23/3128* (2013.01); *H01L 23/3135* (2013.01); *H01L 23/49822* (2013.01); *H01L 23/49827* (2013.01); *H01L 23/49838* (2013.01); *H01L 23/49894* (2013.01); *H01L 24/08* (2013.01); *H01L 2224/08235* (2013.01)

(56) References Cited

U.S. PATENT DOCUMENTS

| | | |
|---|---|---|
| 2006/0128069 A1 | 6/2006 | Hsu |
| 2006/0255440 A1 | 11/2006 | Miyazaki et al. |
| 2010/0300736 A1 | 12/2010 | Miyazaki et al. |
| 2016/0338202 A1 | 11/2016 | Park et al. |
| 2017/0287828 A1 | 10/2017 | Sawada |
| 2017/0309571 A1 | 10/2017 | Yi et al. |
| 2018/0047683 A1 | 2/2018 | Lee et al. |
| 2018/0145033 A1 | 5/2018 | Yi et al. |
| 2019/0287953 A1 | 9/2019 | Moon et al. |

FOREIGN PATENT DOCUMENTS

| | | |
|---|---|---|
| JP | 2014-72279 A | 4/2014 |
| KR | 10-2017-0121671 A | 11/2017 |
| KR | 10-2018-0058095 A | 5/2018 |
| KR | 10-2019-0109186 A | 9/2019 |

OTHER PUBLICATIONS

Taiwanese Office Action dated Apr. 15, 2019 issued in Taiwanese Patent Application No. 107138242 (with English translation).
Japanese Office Action dated Dec. 17, 2019 issued by the Japanese Intellectual Property Office in counterpart Japanese Application No. 2018-203384.

SEMICONDUCTOR PACKAGE

CROSS-REFERENCE TO RELATED APPLICATIONS

This application claims benefit of priorities to Korean Patent Application No. 10-2018-0030337 filed on Mar. 15, 2018, and Korean Patent Application No. 10-2018-0070111 filed on Jun. 19, 2018, in the Korean Intellectual Property Office, the disclosures of which are incorporated herein by reference in their entireties.

BACKGROUND

1. Field

The present disclosure relates to a semiconductor package modularized by mounting a semiconductor chip together with a plurality of passive components in a single package.

2. Description of Related Art

As the size of mobile device displays increase, there has been a need for increasing battery capacity. As battery capacity increases, the area occupied by the battery increases. As a result, the size of the printed circuit board PCB must be reduced, such that mounting areas for components are reduced and interest in modularization is continuously increasing.

Conventional technology for mounting a plurality of parts includes chip-on-board (COB) technology. COB may involve a method of mounting individual passive components and semiconductor packages on a printed circuit board, such as a main board, using surface mount technology (SMT). This may be cost effective, but there can be problems in that a large mounting area is required due to the minimum interval between components, relatively high electromagnetic interference (EMI) between components, and a relatively larger distance between the semiconductor chip and the passive components, which can increase electrical noise.

SUMMARY

An aspect of the present disclosure is to provide a semiconductor package having a novel structure that significantly reduces the mounting area of the semiconductor chip and the passive components, significantly reduces the electrical path between the semiconductor chip and the passive components, significantly reduces process defects such as undulations and cracks, and easily connects the electrodes of the passive components to connection vias by a laser-via hole process or the like.

An aspect of the present disclosure is to provide a semiconductor package having a novel structure in which a passive component and a semiconductor chip are mounted together in a single package to be modularized. In a packaging process, the passive component and the semiconductor chip are encapsulated in two discrete stages. A through-hole for the semiconductor chip is deeper than a through-hole for the passive component. Thus, a step difference is formed between bottom surfaces of the through-holes containing the semiconductor chip and the passive components.

According to an aspect of the present disclosure, a semiconductor package includes a connection structure including a first insulation layer, a second insulation layer, lower in a thickness direction than the first insulation layer, first and second wiring layers on lower surfaces of the first and second insulation layers, respectively, and first and second connection vias passing through the first and second insulation layers, respectively. A core member is on the first insulation layer. A first through-hole passes through the core member, with one or more passive components on the first insulation layer, in the first through-hole, and connected to the first wiring layer through the first connection via. A first encapsulant covers at least a portion of the passive components and fills at least a portion of the first through-hole. A second through-hole passes through the core member and the first insulation layer. A semiconductor chip is on the second insulation layer, in the second through-hole, and connected to the second wiring layer through the second connection via. A second encapsulant covers at least a portion of the semiconductor chip and fills at least a portion of the second through-hole.

According to another aspect of the present disclosure, a semiconductor package includes a core member with first and second through-holes. One or more passive components are in the first through-hole and a semiconductor chip is in the second through-hole. The semiconductor chip has an active surface with a connection pad and an inactive surface opposing the active surface. An encapsulant covers at least a portion of the passive component and at least a portion of the inactive surface of the semiconductor chip, and fills at least a portion of the first through-hole and at least a portion of the second through-hole. A connection structure is on the passive component and the active surface of the semiconductor chip, and includes at least one wiring layer electrically connected to the passive component and the connection pad of the semiconductor chip. The bottom surface of the second through-hole has a step difference from the bottom surface of the first through-hole.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
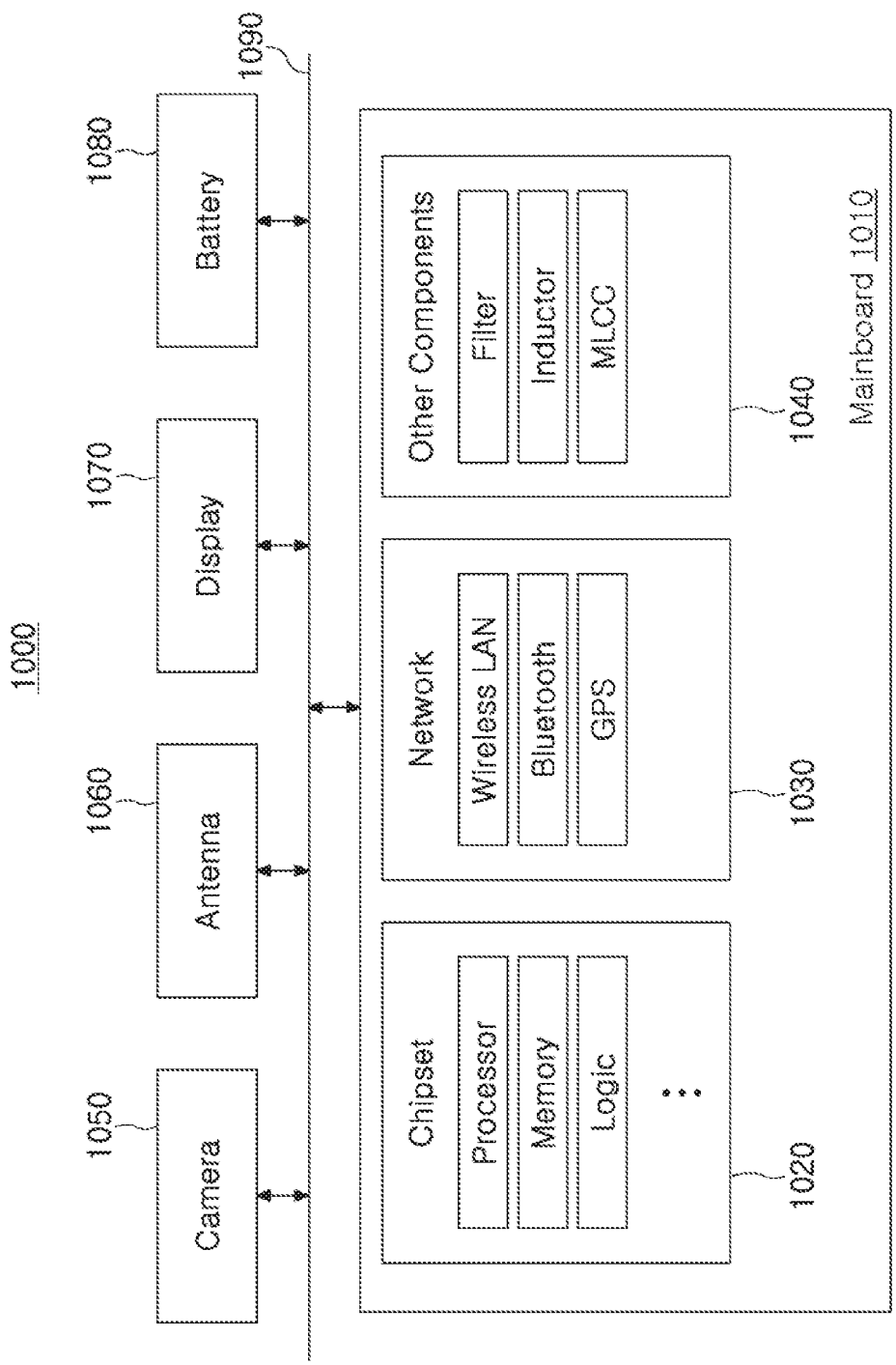
FIG. 1 is a block diagram schematically illustrating an exemplary embodiment of an electronic device system.

Hereinafter, embodiments of the present disclosure will be described as follows with reference to the attached drawings. The shape and size of elements in the drawings may be exaggerated or reduced for clarity.

Electronic Device

FIG. 1 is a block diagram schematically illustrating an exemplary embodiment of an electronic device system.

Referring to the drawings, an electronic device 1000 may include a main board 1010. The main board 1010 may be physically and/or electrically connected to chip-related components 1020, network-related components 1030, and other components 1040. They may be also combined with other components to be described later to form various signal lines 1090.

The chip-related components 1020 may include a memory chip, such as a volatile memory (e.g., DRAM), a non-volatile memory (e.g., ROM), a flash memory, etc.; an application processor chip, such as a central processor (e.g., CPU), a graphics processor (e.g., GPU), a digital signal processor, a cryptographic processor, a microprocessor, a microcontroller, etc.; a logic chip, such as an analog-to-digital converter, an application-specific IC (ASICs), etc.; and the like, but are not limited thereto, and other types of chip-related components may be included. These components 1020 may be combined with each other.

The network-related components 1030 may include Wi-Fi (IEEE 802.11 family, etc.), WiMAX (IEEE 802.16 family, etc.), IEEE 802.20, long term evolution LTE, Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated as the later ones, but are not limited thereto, and any of other various wireless or wired standards or protocols may be further included. The network-related components 1030 may be combined with the chip-related components 1020, as well.

Other components 1040 may include a high frequency inductor, a ferrite inductor, a power inductor, a ferrite bead, a low temperature co-firing ceramic LTCC, an electromagnetic interference EMI filter, and a multilayer ceramic condenser MLCC, but is not limited thereto, and may include other passive components used for various other purposes. Other components 1040 may be combined with each other, in addition to the chip-related components 1020 and/or the network-related components 1030.

Depending on the type of the electronic device 1000, the electronic device 1000 may include other components that may or may not be physically and/or electrically connected to the main board 1010. Other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk CD (not illustrated), and a digital versatile disk DVD (not illustrated), and the like, but is not limited thereto, and other components used for various purposes may be included, depending on the type of the electronic device 1000.

The electronic device 1000 may be a smartphone, a personal digital assistant, a digital video camera, a digital still camera, a network system, a computer, a monitor, a tablet computer, a laptop computer, a netbook, a television, a video game, a smartwatch, an automotive, and the like, but is not limited thereto, and may be any other electronic device that processes data.

Figure 2:
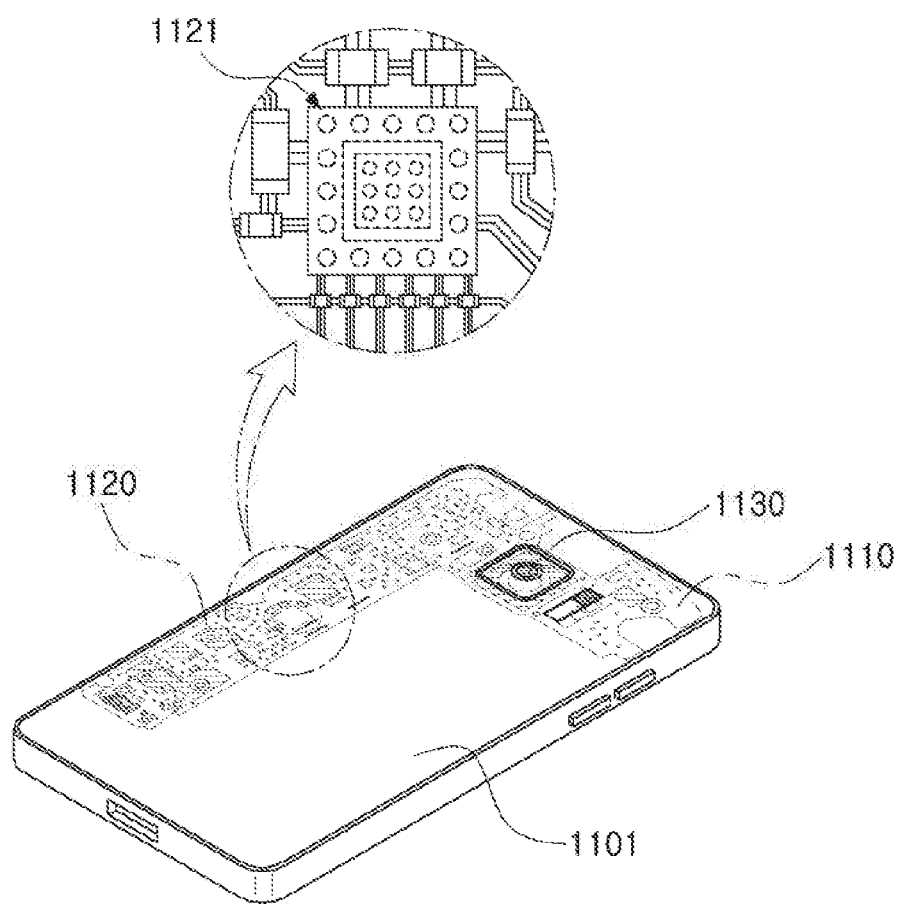
FIG. 2 is a perspective view schematically illustrating an exemplary embodiment of an electronic device.

FIG. 2 is a perspective view schematically illustrating an exemplary embodiment of an electronic device.

Referring to the drawings, a semiconductor package may be applied to various electronic devices as described above for various purposes. For example, a printed circuit board 1110, such as a main board, may be included in a body 1101 of a smartphone 1100. Further, various components 1120 may be physically and/or electrically connected to the printed circuit board 1110. In addition, other components that may or may not be physically and/or electrically connected to the printed circuit board 1110, such as a camera 1130, may be housed within the body 1101. A portion of the components 1120 may be chip-related components, for example, but not limited to, a semiconductor package 1121. The electronic device is not necessarily limited to the smartphone 1100, and may be other electronic device as described above.

Semiconductor Package

In general, a semiconductor chip may have many microelectronic circuits integrated therein, but does not necessarily serve as a finished product of a semiconductor in itself, and the semiconductor chip may be damaged by an external physical or chemical impact. Therefore, the semiconductor chip itself may be not used as it is and may be packaged and used as an electronic device or the like in such a packaged state.

Semiconductor packaging may be necessary, since there may be a difference in a circuit width between a semiconductor chip and a main board of the electronic device in view of an electrical connection. Specifically, for a semiconductor chip, the size of the connection pad and the interval between connection pads are very small and narrow, whereas the size of the component mounting pad and the interval between component mounting pads are much larger and wider than the scale of the semiconductor chip, respectively. Therefore, since it is difficult to directly mount a semiconductor chip on such a main board, there is a need for a packaging technique which may buffer the difference in a circuit width therebetween.

A semiconductor package manufactured by such a packaging technique may be classified as a fan-in semiconductor package or a fan-out semiconductor package, depending on the structure and use thereof.

Hereinafter, the fan-in semiconductor package and the fan-out semiconductor package will be described in more detail with reference to the drawings.

Fan-In Semiconductor Package

Figure 3A:
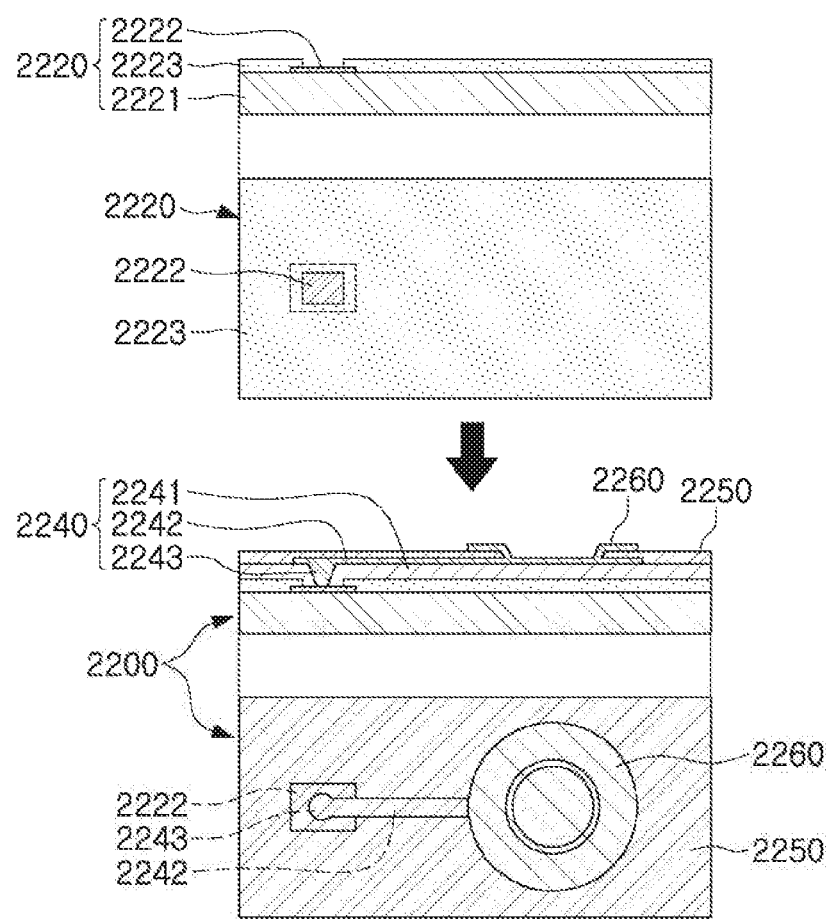
FIGS. 3A and 3B are cross-sectional views schematically illustrating a fan-in semiconductor package, before and after packaging thereof.
Figure 3B:
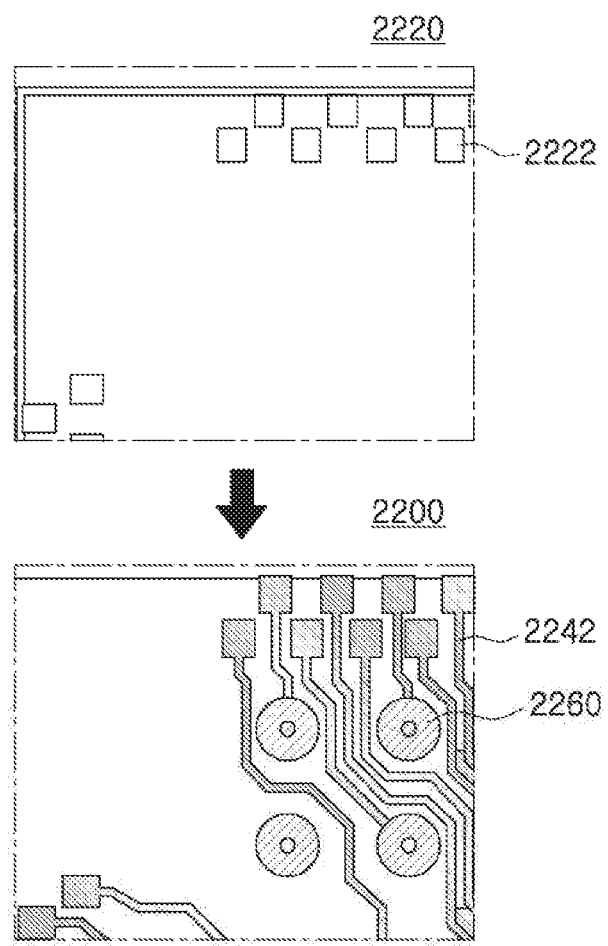

FIGS. 3A and 3B are cross-sectional views schematically illustrating a fan-in semiconductor package, before and after packaging thereof.

Figure 4:
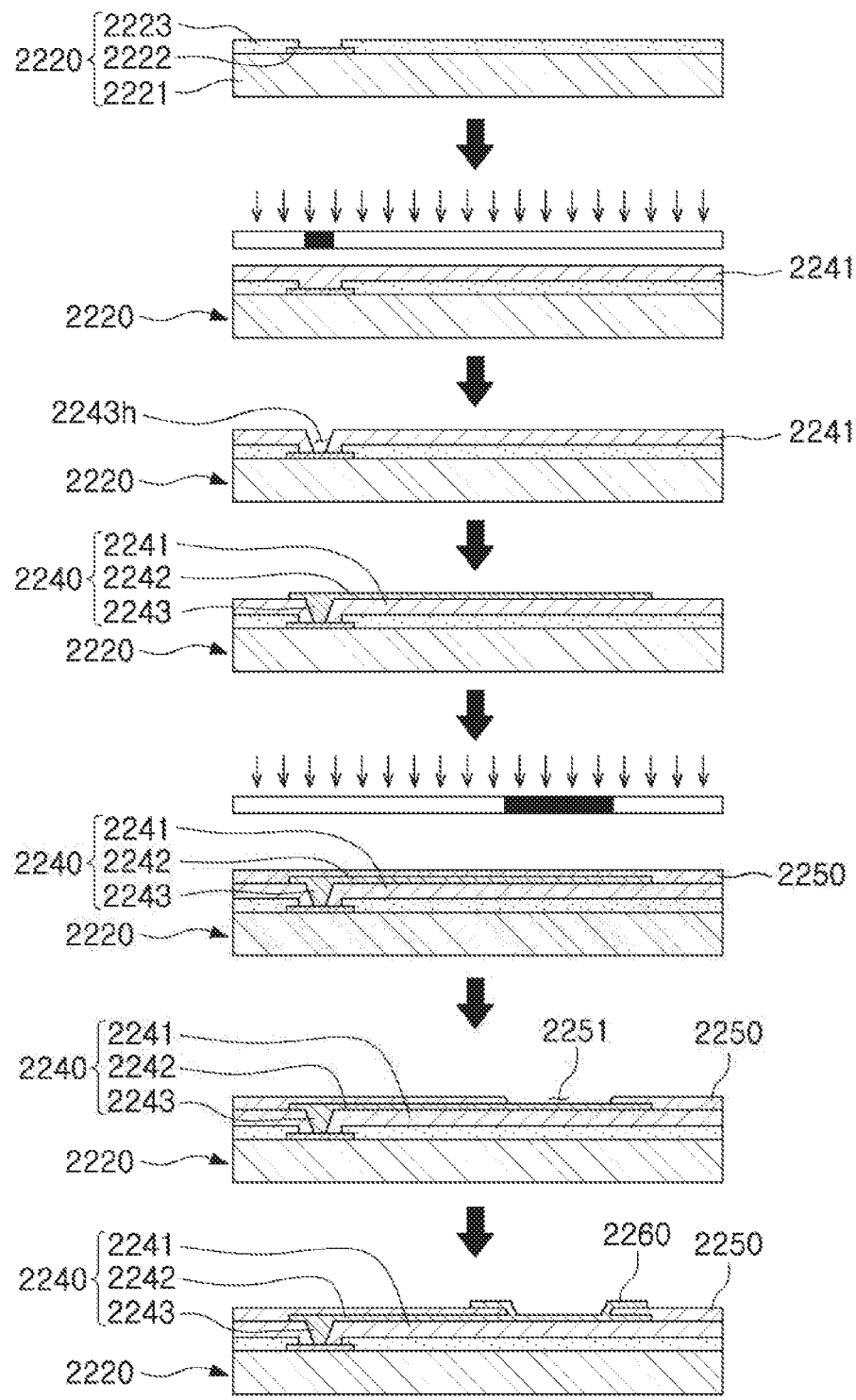
FIG. 4 is a cross-sectional view schematically illustrating a packaging process of a fan-in semiconductor package.

FIG. 4 is a cross-sectional view schematically illustrating a packaging process of a fan-in semiconductor package.

Referring to the drawings, a semiconductor chip 2220 may be an integrated circuit IC in a bare state. A body 2221 may include silicon (Si), germanium (Ge), gallium arsenide (GaAs), or the like. A connection pad 2222 may include a conductive material, such as aluminum (Al) or the like, formed on one surface of the body 2221 A passivation film 2223, such as an oxide film, a nitride film, or the like, may be formed on one surface of the body 2221 and cover at least a portion of the connection pad 2222. At this time, since the connection pad 2222 is very small, it may be difficult to mount the integrated circuit IC even on a medium-level printed circuit board PCB as well as a main board of the electronic device.

A connection structure 2240 may be formed on the semiconductor chip 2220 in conformity with the size of the semiconductor chip 2220, to redistribute the connection pad 2222. The connection structure 2240 may be prepared by way of forming an insulation layer 2241 with an insulating material such as a photo-imageable dielectric resin PID on the semiconductor chip 2220, forming a via hole 2243$h$ for opening the connection pad 2222, and forming a wiring pattern 2242 and a via 2243. Thereafter, a passivation layer 2250 for protecting the connection structure 2240 may be formed, an opening 2251 may be formed, and an under-bump metal layer 2260 or the like may be formed. For example, a fan-in semiconductor package 2200 including, for example, the semiconductor chip 2220, the connection structure 2240, the passivation layer 2250, and the under-bump metal layer 2260 may be formed through a series of processes.

As described above, the fan-in semiconductor package may be a package type in which all the connection pads of the semiconductor chip, for example, input/output (I/O) terminals are arranged inside the element. The fan-in semiconductor package may have good electrical characteristics, and may be produced at relatively low cost. Accordingly, many elements in a smartphone may be manufactured in the form of a fan-in semiconductor package. Specifically, it is being developed in a direction of achieving a small-sized form and realizing fast signal transmission at the same time.

Since, in the fan-in semiconductor package, all of the I/O terminals should be disposed inside the semiconductor chip, there may be many limitations in space. Therefore, such a structure may be difficult to apply to a semiconductor chip having a large number of I/O terminals or a semiconductor chip having a small size. In addition, due to this problem, the fan-in semiconductor package may not be directly mounted on and used in a main board of an electronic device. Even when the size and interval of the I/O terminals of the semiconductor chip are enlarged in a redistributing process, they do not have a size and an interval enough to be directly mounted on the main board of the electronic device.

Figure 5:
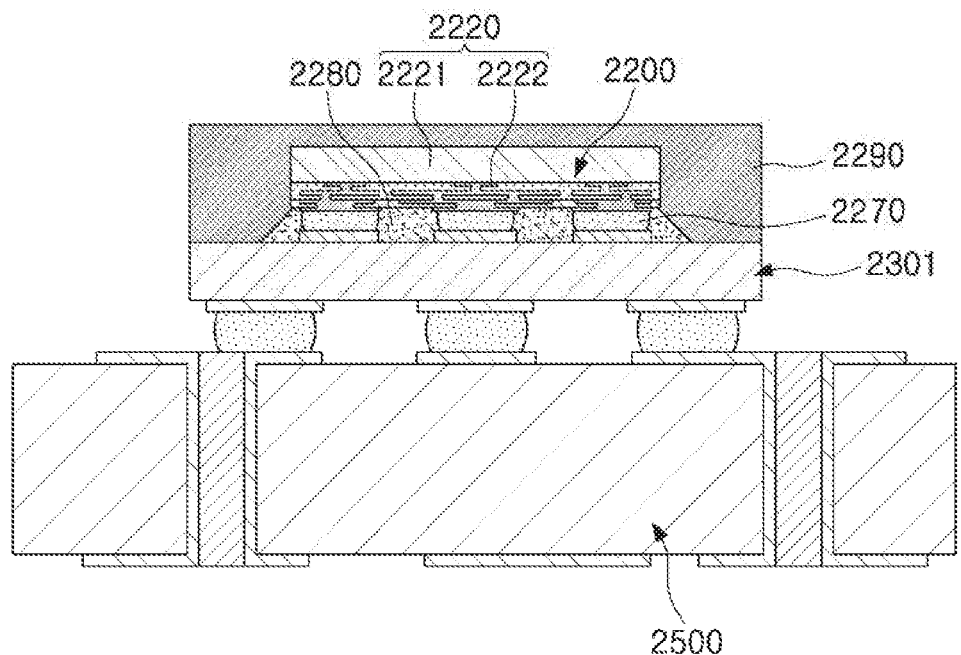
FIG. 5 is a cross-sectional view schematically illustrating a fan-in semiconductor package mounted on a printed circuit board that is ultimately mounted on a main board of an electronic device.

FIG. 5 is a cross-sectional view schematically illustrating a fan-in semiconductor package mounted on a printed circuit board that is ultimately mounted on a main board of an electronic device.

Figure 6:
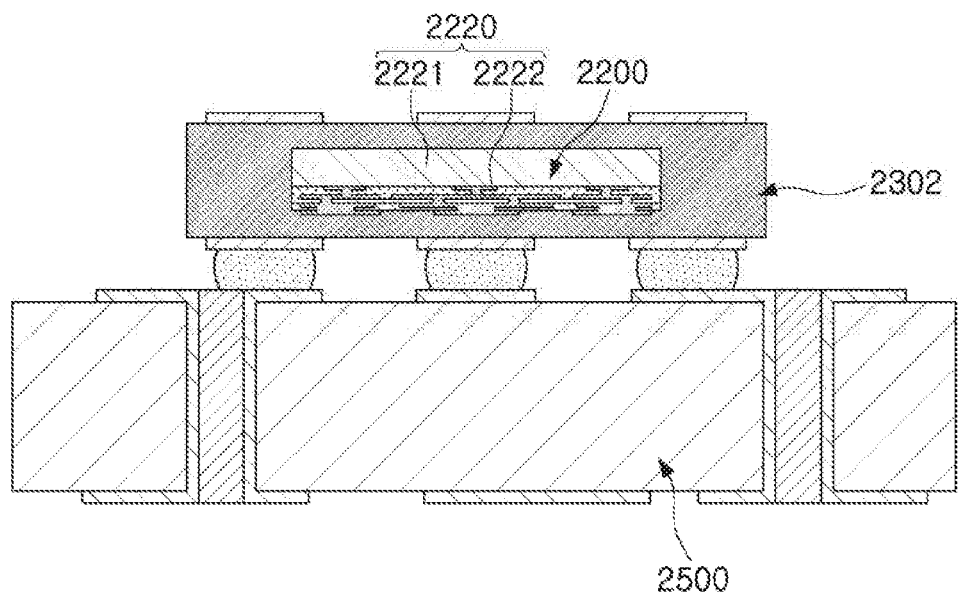
FIG. 6 is a cross-sectional view schematically illustrating a fan-in semiconductor package embedded in a printed circuit board that is ultimately mounted on a main board of an electronic device.

FIG. 6 is a cross-sectional view schematically illustrating a fan-in semiconductor package embedded in a printed circuit board that is ultimately mounted on a main board of an electronic device.

Referring to the drawings, a fan-in semiconductor package 2200 may be configured such that connection pads 2222 of a semiconductor chip 2220, i.e. I/O terminals are redistributed once again through a printed circuit board 2301, and the fan-in semiconductor package 2200 mounted on the printed circuit board 2301 is mounted on a main board 2500 of an electronic device. At this time, a solder ball 2270 and the like may be fixed with an underfill resin 2280, and an outer side thereof may be covered with a molding material 2290 or the like. Alternatively, the fan-in semiconductor package 2200 may be embedded in a separate printed circuit board 2302, and the connection pads 2222 of the semiconductor chip 2220, i.e., the I/O terminals may be redistributed once again in an embedded form, and ultimately mounted on the main board 2500 of the electronic device.

As above, it may be difficult to directly mount the fan-in semiconductor package on the main board of the electronic device. Therefore, it may be mounted on a separate printed circuit board, and may be then mounted on the main board of the electronic device through a packaging process, or may be mounted on the main board of the electronic device in a form embedded in the printed circuit board.

Fan-Out Semiconductor Package

Figure 7:
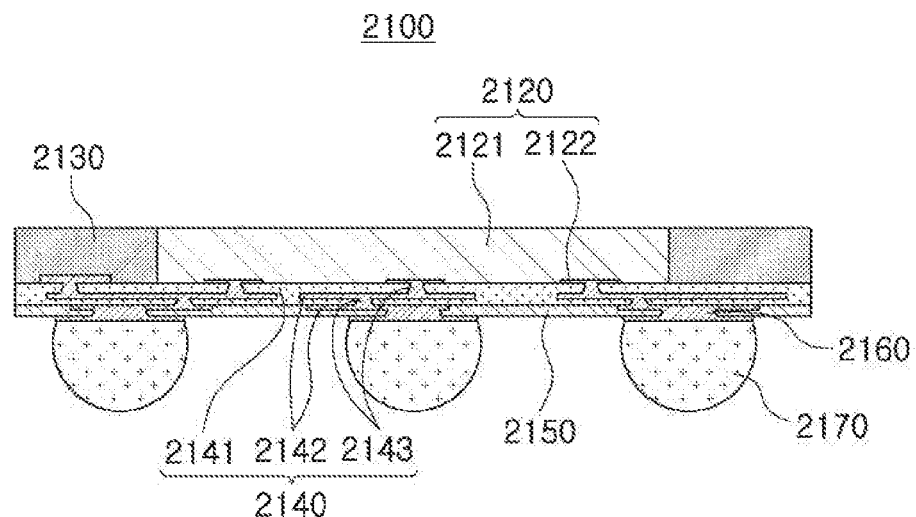
FIG. 7 is a cross-sectional view schematically illustrating a fan-out semiconductor package.

FIG. 7 is a cross-sectional view schematically illustrating a fan-out semiconductor package.

Referring to the drawings, in a fan-out semiconductor package 2100, for example, an outer side of a semiconductor chip 2120 may be protected by an encapsulant 2130, and connection pads 2122 of the semiconductor chip 2120 may be redistributed to the outer side of the semiconductor chip 2120 through a connection structure 2140. A passivation layer 2150 may be further formed on the connection structure 2140. An under-bump metal layer 2160 may be further formed on an opening of the passivation layer 2150. A solder ball 2170 may be further formed on the under-bump metal layer 2160. The semiconductor chip 2120 may be an integrated circuit IC including a body 2121, a connection pad 2122, and the like. The connection structure 2140 may include an insulation layer 2141, a wiring layer 2142 formed on the insulation layer 2241, and a via 2143 for electrically connecting the connection pad 2122 and the wiring layer 2142.

The fan-out semiconductor package may be formed by redistributing the I/O terminals to the outer side of the semiconductor chip through the connection structure formed on the semiconductor chip. As described above, in a fan-in semiconductor package, all of the I/O terminals of the semiconductor chip should be disposed inside of the semiconductor chip. When the size of the element is reduced, the size and pitch of the ball should be reduced. Therefore, the standardized ball layout may be not used. On the other hand, in a fan-out semiconductor package, the I/O terminals may be redistributed outward from the semiconductor chip through the connection structure formed on the semiconductor chip. Although the size of the semiconductor chip is reduced, the standardized ball layout may be used as it is. Therefore, the fan-out semiconductor package may be mounted on a main board of an electronic device without a separate printed circuit board, as described later.

Figure 8:
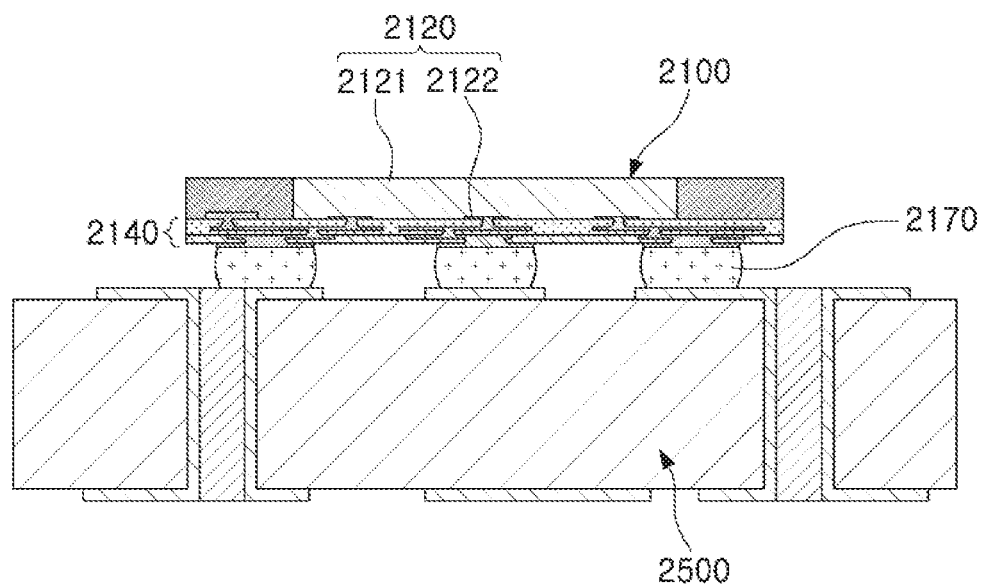
FIG. 8 is a cross-sectional view schematically illustrating a fan-out semiconductor package mounted on a main board of an electronic device.

FIG. 8 is a cross-sectional view schematically illustrating a fan-out semiconductor package mounted on a main board of an electronic device.

Referring to the drawings, a fan-out semiconductor package 2100 may be mounted on a main board 2500 of an electronic device through a solder ball 2170 or the like. For example, as described above, the fan-out semiconductor package 2100 may include a connection structure 2120 on the semiconductor chip 2120 that may redistribute connection pads 2122 to a fan-out area beyond a size of the semiconductor chip 2120. The standardized ball layout may be used as it is, and as a result, it may be mounted on the main board 2500 of the electronic device without a separate printed circuit board or the like.

Since the fan-out semiconductor package may be mounted on the main board of the electronic device without a separate printed circuit board, as above, the fan-out semiconductor package may be made thinner than the fan-in semiconductor package using the printed circuit board. Therefore, a downsizing and thinning in the fan-out semiconductor package may be accomplished. It may be also suitable for mobile products because of its excellent thermal and electrical properties. In addition, it may be implemented more compactly than a general package-on-package POP type using a printed circuit board PCB, and a problem caused by a bending phenomenon may be prevented.

The fan-out semiconductor package may refer to a package technology for mounting the semiconductor chip on a main board of the electronic device, or the like, and for protecting the semiconductor chip from an external impact, and may have a concept different from a printed circuit board PCB, such as a printed circuit board in which a fan-in semiconductor package is embedded, which are different from each other in view of scale, use, and the like.

Hereinafter, a semiconductor package having a novel structure, which significantly reduces a mounting area of a semiconductor chip and a passive component, significantly reduces an electrical path between a semiconductor chip and a passive component, significantly reduces process defects such as undulations and cracks, and, furthermore, easily connects electrodes of passive components to connection vias by a laser-via hole process or the like, may be described with reference to the drawings.

Figure 9:
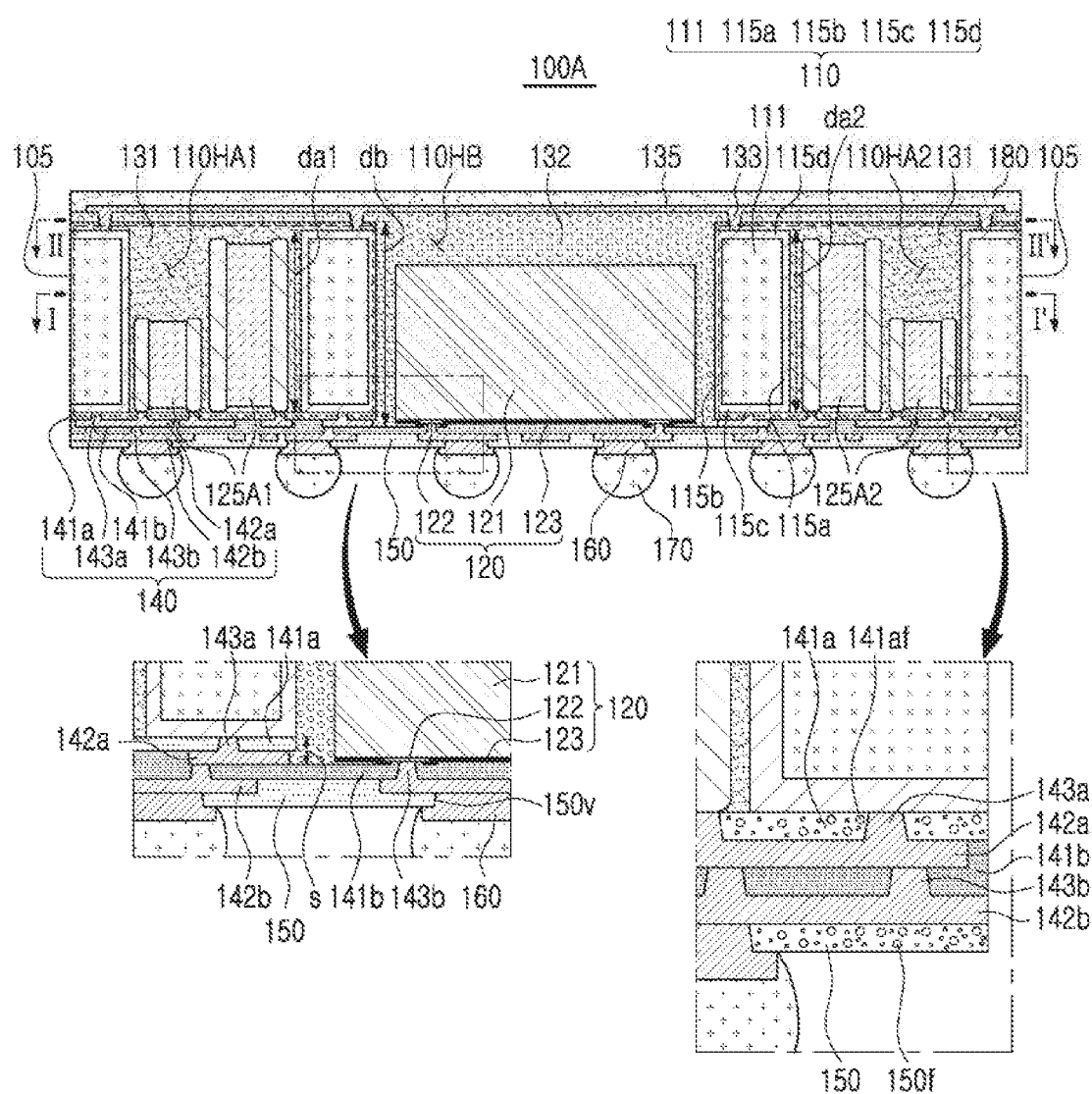
FIG. 9 is a cross-sectional view schematically illustrating an exemplary embodiment of a semiconductor package.

FIG. 9 is a cross-sectional view schematically illustrating an exemplary embodiment of a semiconductor package.

Figure 10A:
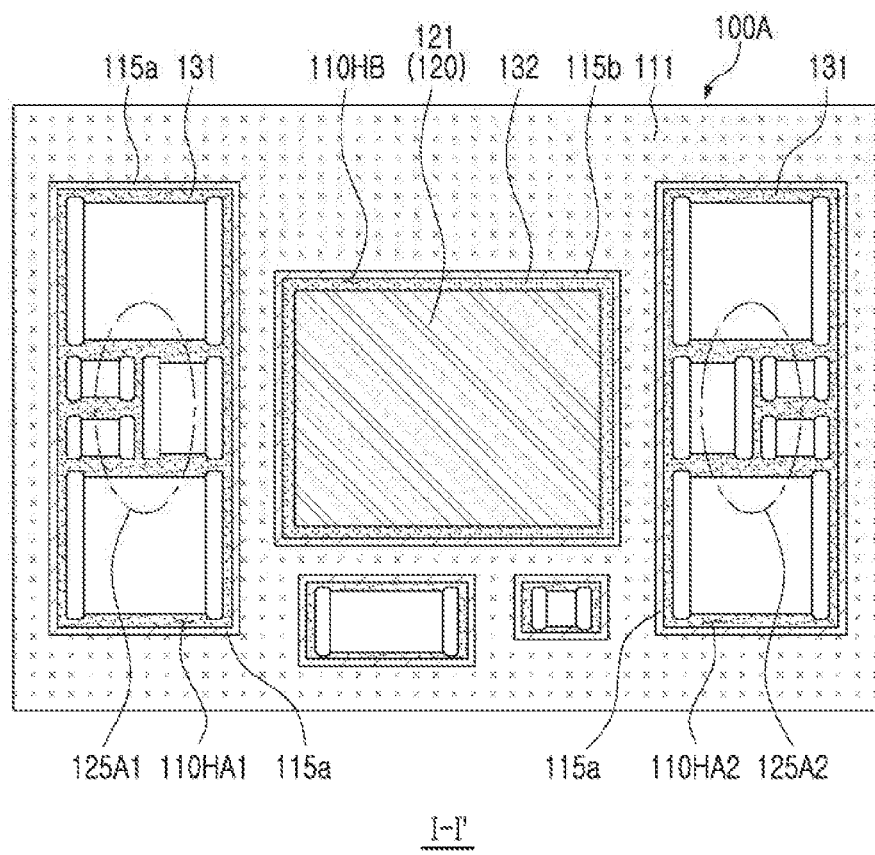
FIG. 10A is a schematic top view of a semiconductor package of FIG. 9 taken along line I-I'.

FIG. 10A is a schematic top view of a semiconductor package of FIG. 9 taken along line I-I'.

Figure 10B:
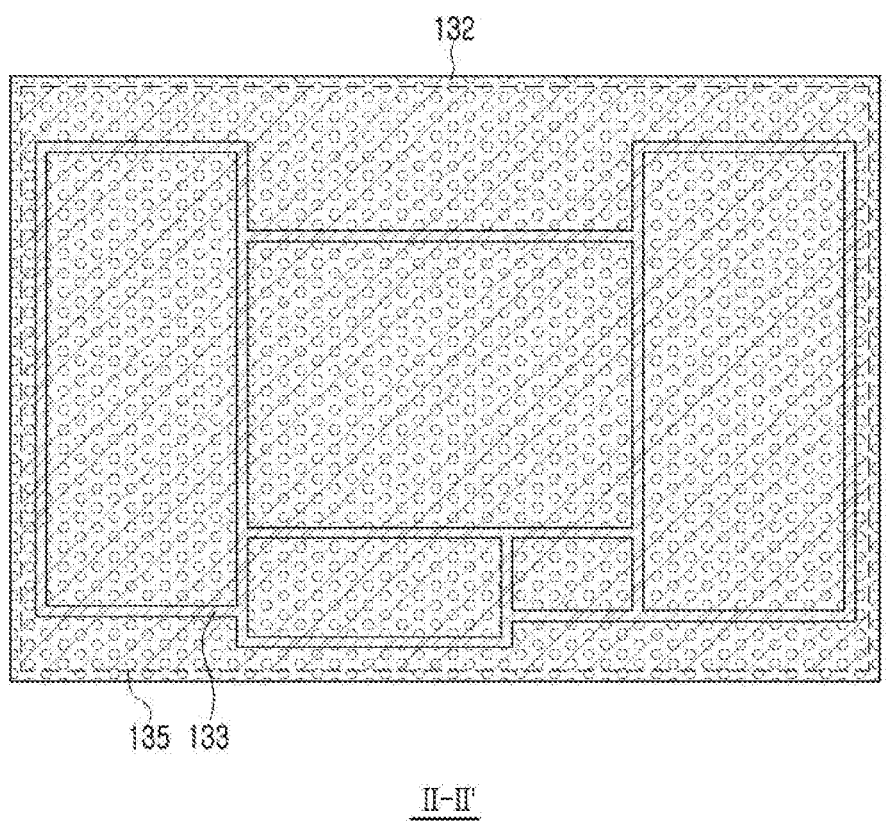
FIG. 10B is a schematic top view of a semiconductor package of FIG. 9 taken along line II-II'.

FIG. 10B is a schematic top view of a semiconductor package of FIG. 9 taken along line II-II'.

The drawings illustrate a semiconductor package 100A according to an exemplary embodiment. A connection structure 140 includes a first insulation layer 141a, a second insulation layer 141b lower than the first insulation layer 141a, first and second wiring layers 142a and 142b on lower surfaces of the first and second insulation layers 141a and 141b, respectively, and first and second connection vias 143a and 143b passing through the first and second insulation layers 141a and 141b, respectively. A core structure 105 includes a core member 110 on the first insulation layer 141a, with first through-holes 110HA1 and 110HA2 passing through the core member 110. One or more passive components 125A1 and 125A2 are on the first insulation layer 141a in the first through-holes 110HA1 and 110HA2 and connected to the first wiring layer 142a through the first connection via 143a. A first encapsulant 131 covers at least a portion of the passive components 125A1 and 125A2 and fills at least a portion of the first through-holes 110HA1 and 110HA2. A second through-hole 110HB passes through the core structure 105 and the first insulation layer 141a. A semiconductor chip 120 is on the second insulation layer 141b of the second through-hole 110H2 and connected to the second wiring layer 142b through the second connection via 143b. A second encapsulant 132 encapsulates the semiconductor chip 120 and fills at least a portion of the second through-hole 110HB.

A depth "db" of the second through-hole 110HB may be deeper than depths "da1" and "da2" of the first through-holes 110HA1 and 110HA2. A bottom surface of the second through-hole 110HB may thus be lower than the bottom surfaces of the first through-holes 110HA1 and 110HA2. These bottom surfaces may have step differences. The bottom surface of the second through-hole 110HB may be an upper surface of the second insulation layer 141b, and the bottom surface of the first through-holes 110HA1 and 110HA2 may be an upper surface of the first insulation layer 141a. For example, the semiconductor chip 120 may have an active surface with a connection pad 122 connected to the second connection via 143b, and an inactive surface opposing the active surface. The semiconductor chip 120 may be positioned with its lower surface lower than the lower surface of the passive components 125A1 and 125A2. For example, the active surface of the semiconductor chip 120 may be substantially coplanar with a lower surface of the first wiring layer 143a.

Recently, as mobile displays have increased in size, there has been a need for increased battery capacity. As the battery capacity increases, the area occupied by the battery increases. To this end, the size of the printed circuit board PCB may need to be reduced. As a result, the mounting area of the components may be reduced. Furthermore, interest in modularization is continuously increasing. As a conventional technology for mounting a plurality of components, a chip-on-board (COB) technique may be exemplified. The COB may be a method of mounting individual passive elements and semiconductor packages on a printed circuit board using a surface mount technology (SMT). This method may be cost effective, but there may be problems in the large mounting area required due to a minimum interval between the components, relatively high electromagnetic interference (EMI) between the components, and relatively long distances between the semiconductor chip and the passive components, which can increase electrical noise.

On the other hand, in the semiconductor package 100A according to an exemplary embodiment, the plurality of passive components 125A1 and 125A2 may be arranged and modularized in a single package, together with the semiconductor chip 120. Therefore, the mounting area on the printed circuit board such as a main board may be significantly reduced, which may significantly reduce an interval between the components. Further, the electrical path between the semiconductor chip 120 and the passive components 125A1 and 125A2 may be significantly reduced, thereby reducing the noise problem. In addition, since there are two or more encapsulating operations 131 and 132, rather than a single encapsulating operation, a problem of low yields due to poor mounting of the passive components 125A1 and 125A2 effects of foreign materials when mounting the passive components 125A1 and 125A2, and the like, may be significantly reduced.

The connection pad of the semiconductor chip may be usually made of aluminum (Al), and may be easily damaged during a laser-via process. Therefore, it may be common to open the connection pad by a photo-via process, rather than the laser-via process. For this purpose, a photo-imageable dielectric material PID may be used as the insulation layer provided to form a redistribution layer RDL. When a photo-imageable dielectric material PID is similarly stacked to form a redistribution layer RDL on a lower surface of the passive component, undulation may occur due to protrusion of an electrode in the passive components. As a result, a flatness of the photo-imageable dielectric material PID may be lowered. Therefore, there may be an inconvenience that a relative thick photo-imageable dielectric material PID should be used to increase the flatness. In this case, cracks may easily occur due to the thickness of the photo-imageable dielectric material PID.

Further, when the passive component may be encapsulated using an encapsulant, a problem may occur in which an encapsulant forming material may bleed into an electrode of the passive component. In this case, when a photo-imageable dielectric material PID is used to form the redistribution layer RDL, the photo-via process may be used as described above. In this case, it may be difficult to open the bled encapsulant forming material with the photo-via process. Therefore, a defect opening the electrode may occur due to the bled encapsulant forming material, resulting in deterioration of electrical characteristics.

On the other hand, in the semiconductor package 100A according to an exemplary embodiment, the first through-holes 110HA1 and 110HA2 in which the passive components 125A1 and 125A2 will be arranged may be formed initially, the passive components 125A1 and 125A2 may be then arranged, the first insulation layer 141a and the first wiring layer 142a may be formed to redistribute primarily the passive components 125A1 and 125A2. Thereafter, the second through-hole 110HB passing through the first insulation layer 141a may be formed, the semiconductor chip 120 may be disposed, and the second insulation layer 142b and the second wiring layer 142b for secondarily redistributing the semiconductor chip 120 may be formed. For example, the second through-hole 110HB in which the semiconductor chip 120 is disposed may not only pass through the core member 110 but also the first insulation layer 141a of the connection structure 140. Therefore, the active surface of the semiconductor chip 120 may be positioned in a position lower than a position of the lower surface of each of the passive components 125A1 and 125A2. In this case, the material of the first insulation layer 141a may be selected, regardless of the semiconductor chip 120. For example, a non-photo-imageable dielectric material including the inorganic filler 141af, not a photo-imageable dielectric material PID, such as ABF (Ajinomoto Build-up Film), or the like, may be used. This film type of non-photo-imageable dielectric material may have excellent flatness, and thus may solve the above-described problems regarding undulation and cracks more effectively.

Such a non-photo-imageable dielectric material may form an opening by the laser-via process. Even when the material of the first encapsulant 131 is bled into the electrode of the passive components 125A1 and 125A2, the electrode may be effectively opened by the laser-via process. Therefore, a problem caused by a defect opening the electrode may be prevented.

The semiconductor package 100A according to an exemplary embodiment may use a photo-imageable dielectric material PID as the second insulation layer 141b, as in the conventional case. In this case, a fine pitch may be introduced through the photo-via process. Tens to millions of the connection pads 122 in the semiconductor chip 120 may be redistributed very effectively as in the conventional case. For example, in the structure of the semiconductor package 100A according to an exemplary embodiment, the materials of the first wiring layer 142a for redistributing the passive components 125A1 and 125A2, the first insulation layer 141a on which the first connection via 143a is formed, the second wiring layer 142b for redistributing the connection pad 122 of the semiconductor chip 120, and the second insulation layer 141b on which the second connection via 143b is formed, may be selectively controlled to have an excellent synergy effect.

The semiconductor package 100A according to an exemplary embodiment may further include a passivation layer 150 below the connection structure 140 and having an opening 150v exposing at least a portion of the second wiring layer 142b, an under-bump metal layer 160 disposed on the opening of the passivation layer 150 and connected to the exposed at least a portion of the second wiring layer 142b, and an electrical connection structure 170 under the passivation layer 150 and connected to the second wiring layer 142b that is exposed through the under-bump metal layer 160, and, thereby, may be connected to a main board or the like.

The semiconductor package 100A according to an exemplary embodiment may further include metal layers 115a, 115b, 115c, and 115d formed on wall surfaces and upper and lower surfaces of the core insulation layer 111 in a core member 110 in which the first and second through-holes 110HA1, 110HA2, and 110HB are formed, and, thereby, may effectively shield electro-magnetic interference EMI introduced out of or discharge into the semiconductor chip 120 and the passive components 125A1 and 125A2, and, further, a heat radiation effect may be achieved. In addition, EMI shielding and heat radiation effects of the semiconductor chip 120 and the passive components 125A1 and 125A2 may be further improved through a backside metal layer 135 disposed on the first encapsulant 131 and/or the second encapsulant 132, and a backside metal via 133 passing through the first encapsulant 131 and/or the second encapsulant 132. A cover layer 180 covering the backside metal layer 135 may be further disposed on the first encapsulant 131 and/or the second encapsulant 132 to protect the backside metal layer 135.

Hereinafter, each configuration included in the semiconductor package 100A according to one example will be described in more detail.

The core member 110 may further improve the rigidity of the package module 100A according to a specific material, and may play a role of ensuring the thickness uniformity of the first encapsulant 131 and the second encapsulant 132 and the like. The core member 110 may have a plurality of first through-holes 110HA1 and 110HA2. The plurality of first through-holes 110HA1 and 110HA2 may be physically spaced apart from each other. The passive components 125A1 and 125A2 may be arranged in the first through-holes 110HA1 and 110HA2, respectively. Each of the passive components 125A1 and 125A2 may be surrounded by wall surfaces of each of the first through-holes 110HA1 and 110HA2 and spaced apart by a predetermined distance from the wall surfaces of the first through-holes 110HA1 and 110HA2, but may be variously modified as needed.

The core member 110 may include a core insulation layer 111. The material of the core insulation layer 111 is not particularly limited. For example, an insulating material may be used. As the insulating material, a thermosetting resin such as an epoxy resin, a thermoplastic resin such as polyimide, or a resin in which the above resins are impregnated into a core material, such as glass fiber, glass cloth, glass fabric, etc., for example, prepreg, ABF (Ajinomoto Build-up Film), and the like, may be used.

The core member 110 may include first and second metal layers 115a and 115b disposed on wall surfaces of the core insulation layer 111 on which the first and second through-holes 110HA1, 110HA2, and 110HB are formed, and surrounding the passive components 125A1 and 125A2 and the semiconductor chip 120, respectively, and third and fourth metal layers 115c and 115d arranged on lower and upper surfaces of the core insulation layer 111, respectively. The first to fourth metal layers 115a, 115b, 115c, and 115d may include copper (Cu), aluminum (Al), silver (Ag), tin (Sn), gold (Au), nickel (Ni), lead (Pb), titanium (Ti), or alloys thereof, but are not limited thereto. Electromagnetic wave shielding and heat dissipation of the semiconductor chip 120 and the passive components 125A1 and 125A2 may be achieved through the first to fourth metal layers 115a, 115b, 115c, and 115d. The metal layers 115a, 115b, 115c, and 115d may be connected to each other, and may be also used as a ground. In this case, the metal layers 115a, 115b, 115c, and 115d may be electrically connected to the ground of the wiring layers 142a and 142b of the connection structure 140.

Each of the passive components 125A1 and 125A2 may be independently a capacitor such as a multilayer ceramic capacitor MLCC or a low inductance chip capacitor LICC, an inductor such as a power inductor, and a bead, or the like. The passive components 125A1 and 125A2 may have different thicknesses from each other. In addition, the passive components 125A1 and 125A2 may have thicknesses different from those of the semiconductor chip 120. The semiconductor package 100A according to an exemplary embodiment may encapsulate them in two or more operations, which may significantly reduce the problem of defects due to such thickness variations. The number of the passive components 125A1 and 125A2 is not particularly limited, and may be relatively greater or less in the drawings.

The first encapsulant 131 may encapsulate the passive components 125A1 and 125A2, respectively, and may also fill at least a portion of each of the first through-holes 110HA1 and 110HA2. Also, in one example, the core member 110 may be also encapsulated. The first encapsulant 131 may include an insulating material, and examples of the insulating material may include a material including an inorganic filler and an insulating resin, for example, a thermosetting resin such as an epoxy resin, a thermoplastic resin such as polyimide, a resin including the above materials with a reinforcing material such as an inorganic filler, specifically ABF, FR-4, BT, a resin, and the like. In addition, a molding material such as EMC may be used. Further, a photo-imageable material, For example, a photo-imageable encapsulant PIE may be used, as needed. An insulating resin such as a thermosetting resin or a thermoplastic resin may use a material impregnated with a core material such as an inorganic filler and/or glass fiber, glass cloth, glass fabric, or the like.

The semiconductor chip 120 may be disposed in the second through-hole 110HB. The semiconductor chip 120 may be spaced apart from the wall surfaces of the second through-hole 110HB by a predetermined distance, and may be surrounded by the wall surfaces of the second through-hole 110HB, but may be modified, as needed. The semiconductor chip 120 may be an integrated circuit IC in which hundreds to millions of elements are integrated into one chip. The integrated circuit may be a power management IC (PMIC), but is not limited thereto, and may be a volatile memory (e.g., a DRAM), a non-volatile memory (e.g., ROM), a memory chip such as a flash memory; an application processor chip, such as a central processor (e.g., CPU), a graphics processor (e.g., GPU), a digital signal processor, a cryptographic processor, a microprocessor, and the like; an analog-to-digital converter, a logic chip such as an application-specific IC (ASIC), or the like.

The semiconductor chip 120 may be an integrated circuit in a bare state in which no separate bump or wiring layer is formed. The integrated circuit may be formed based on an active wafer. In this case, silicon (Si), germanium (Ge), gallium arsenide (GaAs), or the like may be used as the base material of the body 121 of the semiconductor chip 120. Various circuits may be formed in the body 121. The connection pad 122 may be used to electrically connect the semiconductor chip 120 to other components, and a conductive material such as aluminum (Al) may be used as a formation material thereof without any particular limitation. A passivation film 123 exposing the connection pad 122 may be formed on the body 121. The passivation film 123 may be an oxide film or a nitride film, or may be a double layer of an oxide film and a nitride film. An insulating film (not illustrated) or the like may be further disposed in other necessary positions. Meanwhile, in the semiconductor chip 120, a surface on which the connection pad 122 is disposed may become an active surface, and a surface opposite thereto may become an inactive surface. At this time, when the passivation film 123 is formed on the active surface of the semiconductor chip 120, the active surface of the semiconductor chip 120 may determine a positional relationship based on the lowermost surface of the passivation film 123.

The second encapsulant 132 may encapsulate the semiconductor chip 120, and may also fill at least a portion of the through-hole 110HA. In one example, the first encapsulant 131 may be also encapsulated. The second encapsulant 132 may also include an insulating material. Examples of the insulating material may include a resin including an inorganic filler and an insulating resin such as a thermosetting resin such as an epoxy resin, a thermoplastic resin such as polyimide, or a resin including the above materials with a reinforcing material such as an inorganic filler, specifically ABF, FR-4, BT, PID resin, etc. In addition, a known molding material such as EMC may be used. An insulating resin such as a thermosetting resin or a thermoplastic resin may use a material impregnated with a core material such as an inorganic filler and/or glass fiber, glass cloth, glass fabric, or the like.

The first encapsulant 131 and the second encapsulant 132 may be the same material, and may be different materials. Even when the first encapsulant 131 and the second encapsulant 132 include the same material, the boundary therebetween may be confirmed. The first encapsulant 131 and the second encapsulant 132 may include similar materials, but may have different colors. For example, the first encapsulant 131 may be more transparent than the second encapsulant 132, such that the boundary therebetween may be clear. The first encapsulant 131 may be formed of an insulating material, while the second encapsulant 132 may be formed of a magnetic material, as needed. In this case, the second encapsulant 132 may have an EMI absorption effect. In a case of the semiconductor chip 120, the electrodes may be not exposed through the body 121. Therefore, even when the second encapsulant 132 is formed of a magnetic material, there may be no particular problem.

The backside metal layer 135 may be disposed on the second encapsulant 132 to cover the semiconductor chip 120 and the passive components 125A1 and 125A2. The backside metal layer 135 may be connected to the fourth metal layer 115d of the core member 110 through the backside metal via 133 passing through the first encapsulant 131 and the second encapsulant 132. The semiconductor chip 120 and the passive components 125A1 and 125A2 may be surrounded by a metal material through the backside metal layer 135 and the backside metal via 133 to further improve the EMI shielding effect and the heat radiation effect. The backside metal layer 135 and the backside metal via 133 may also include conductive materials, such as copper (Cu), aluminum (Al), silver (Ag), tin (Sn), gold (Au), nickel (Ni), lead (Pb), titanium (Ti), or an alloy thereof. The backside metal layer 135 and the backside metal via 133 may also be used as a ground. In this case, the metal layers 115a, 115b, 115c, and 115d may be electrically connected to the ground of the wiring layers 142a and 142b of the connection structure 140. The backside metal layer 135 may be in the form of a plate covering most of the upper surface of the second encapsulant 132, as illustrated in FIG. 10B. The backside metal layer 133 may be in the form of a trench via having a predetermined length, as illustrated in FIG. 10B. In this case, moving paths of the electromagnetic waves may be substantially shut off to have a better electromagnetic wave shielding effect, but is not limited thereto. The backside metal layer 135 may have a plurality of plate forms within the range of shielding the electromagnetic wave. An opening may be formed in the middle of the backside metal via 133 to provide gas moving paths.

The connection structure 140 may redistribute the connection pads 122 of the semiconductor chip 120. Further, the semiconductor chip 120 and the passive components 125A1 and 125A2 may be electrically connected. The connection pads 122 of the several hundreds of semiconductor chips 120 having various functions may be redistributed through the connection structure 140, respectively. The connection pads 122 may be physically and/or electrically connected to the outer side through the electrical connection structure 170, depending on the function thereof. The connection structure 140 may include a first insulation layer 141a disposed in a position lower than a position of the core member 110 and the passive components 125A1 and 125A2, a first wiring layer 142a disposed on the lower surface of the first insulation layer 141a, a first connection via 143a passing through the first insulation layer 141a and electrically connecting the passive components 125A1 and 125A2, a second insulation layer 141b disposed on the lower surface of the first insulation layer 141a and on the active surface of the semiconductor chip 120 and covering at least a portion of the first wiring layer 142a, a second wiring layer 142b disposed on the lower surface of the second insulation layer 141b, and a second connection via 143b passing through the second insulation layer 141b and electrically connecting the first and second wiring layers 142a and 142b and the connection pad 122 of the semiconductor chip 120 and the second wiring layer 142b. The connection structure 140 may include more insulation layers, wiring layers, and connection via layers than those illustrated in the figures.

As the material of the first insulation layer 141a, an insulating material may be used. At this time, as the insulating material, a non-photo-imageable dielectric material including an inorganic filler 141af such as silica or alumina, for example, ABF may be used. This may more effectively prevent a problem of undulation and defects caused by cracking. In addition, this may effectively solve open electrode defects of the passive components 125A1 and 125A2 that may be caused by bleeding of the material forming the first encapsulant 131. For example, when the non-photo-imageable dielectric material including the inorganic filler 141af is used as the first insulation layer 141a, the problem of simply using the photo-imageable dielectric material PID may be more effectively solved.

As the second insulation layer 141b, a photo-imageable dielectric material PID may be used. In this case, a fine pitch through the photo-via process may be also introduced, such that the connection pads 122 in tens to millions of the semiconductor chips 120 may be redistributed very effectively as in the normal case. The photo-imageable dielectric material PID may or may not include a small amount of inorganic filler. For example, the first wiring layer 142a for redistributing the passive components 125A1 and 125A2 and the first insulation layer 141a on which the first connection via 143a may be formed and the connection pad 122 of the semiconductor chip 120, the second wiring layer 142b for redistributing the first connection via 143a and the second insulation layer 141b for forming the second connection via 143b may be selectively controlled to have a superior synergistic effect.

The first insulation layer 141a formed of a non-photo-imageable dielectric material including the inorganic filler 141af may be a plurality of layers, and the second insulation layer 141b formed of a photo-imageable dielectric material PID It may be a plurality of layers, all of which may be a plurality of layers. The second through-hole 110HB may pass through the first insulation layer 141a formed of a non-photo-imageable dielectric material, and may pass through all of the plurality of layers, when the first insulation layer 141a has a plurality of layers.

The first insulation layer 141a may have a lower coefficient of thermal expansion (CTE) than a CTE of the second insulation layer 141b. This is because the first insulation layer 141a may include the inorganic filler 141af. In this case, the weight percentage of the inorganic filler 141af included in the first insulation layer 141a may be greater than that of the second insulation layer 141b, although the second insulation layer 141b may include small amounts of an inorganic filler (not illustrated), as needed. Therefore, the coefficient of thermal expansion CTE of the first insulation layer 141a may be lower than the coefficient of thermal expansion CTE of the second insulation layer 141b. Since the inorganic filler 141af has a relatively larger amount, the first insulation layer 141a having a relatively lower coefficient of thermal expansion CTE may be advantageous to warpage, such as a relatively lower thermal shrinkage. As described above, the problem of occurrence of an undulation or a crack may be more effectively overcome, and the problem of electrode open defect of the passive components 125A1 and 125A2 may be more effectively improved.

The first wiring layer 142a may be electrically connected to the connection pad 122 of the semiconductor chip 120 by redistributing the electrodes of the passive components 125A1 and 125A2. For example, it may function as a redistribution layer RDL. As the material for forming the first wiring layer 142a, conductive materials, such as copper (Cu), aluminum (Al), silver (Ag), tin (Sn), gold (Au), nickel (Ni), lead (Pb), titanium (Ti), or alloys thereof may be used. The first wiring layer 142a may perform various functions, depending on a desired design. For example, it may include a ground (GND) pattern, a power (PWR) pattern, a signal (S) pattern, and the like. In this case, the signal pattern may include various signals except for a ground pattern, a power pattern, and the like, for example, a data signal and the like. Also, a via pad or the like may be included. The second through-hole 110HB, in which the semiconductor chip 120 is disposed, may also pass through the first insulation layer 141a. The lower surface of the first wiring layer 142a may be substantially the same level as the active surface of the semiconductor chip 120. For example, the lower surface of the first wiring layer 142a may be coplanar with the active surface of the semiconductor chip 120.

The second wiring layer 142b may be electrically connected to the electrical connection structure 170 by redistributing the connection pad 122 of the semiconductor chip 120. For example, it may function as a redistribution layer RDL. As the material for forming the second wiring layer 142b, conductive materials, such as copper (Cu), aluminum (Al), silver (Ag), tin (Sn), gold (Au), nickel (Ni), lead (Pb), titanium (Ti), or alloys thereof may be used. The second wiring layer 142b may also perform various functions, depending on a desired design. For example, it may include a ground pattern, a power pattern, a signal pattern, and the like. In this case, the signal pattern may include various signals except for a ground pattern, a power pattern, and the like, for example, a data signal and the like. Also, a via pad or the like may be included. Further, a via pad, an electrical connection structure pad, and the like may be included.

The first connection via 143a may be electrically connected to the passive components 125A1 and 125A2 and the first wiring layer 142a. The first connection via 143a may be physically in contact with the electrode of each of the passive components 125A1 and 125A2. For example, the passive components 125A1 and 125A2 may be in direct contact with the first connection via 143a in an embedded type, rather than a surface mount type, using a solder bump or the like. As the material of forming the first connection via 143a, conductive materials, such as copper (Cu), aluminum (Al), silver (Ag), tin (Sn), gold (Au), nickel (Ni), lead (Pb), titanium (Ti), or alloys thereof may be used. The first connection via 143a may be entirely filled with a conductive material, or may be those in which a conductive material is formed along the wall of the via. Further, a shape of the first connection via 143a may be tapered.

The second connection via 143b may be electrically connected to the first and second wiring layers 142a and 142b formed on different layers from each other, and may be electrically connected to the connection pad 122 and the second wiring layer 142b of the semiconductor chip 120. The second connection via 143b may be physically in contact with the connection pad 122 of the semiconductor chip 120. For example, the semiconductor chip 120 may be directly connected to the second connection via 143b of the connection structure 140 in the form of a bare die with no bump or the like. As the material for forming the second connection via 143b, conductive materials, such as copper (Cu), aluminum (Al), silver (Ag), tin (Sn), gold (Au), nickel (Ni), lead (Pb), titanium (Ti), or alloys thereof may be used. The second connection via 143b may also be entirely filled with a conductive material, or may be those in which a conductive material is formed along the wall of the via. Further, the shape of the second connection via 143b may be tapered.

The passivation layer 150 may protect the connection structure 140 from an external physical and chemical damage, or the like. The passivation layer 150 may have an opening exposing at least a portion of the second wiring layer 142b of the connection structure 140. Such an opening may be formed in the passivation layer 150 in the range of tens to thousands. The passivation layer 150 may include an insulating resin and an inorganic filler 150f, but may not include glass fibers. For example, the passivation layer 150 may be ABF, but is not limited thereto.

The under-bump metal layer 160 may improve the connection reliability of the electrical connection structure 170, and thus improve the board level reliability of the package module 100A. The under-bump metal layer 160 may be connected to the second wiring layer 142b of the connection structure 140 exposed through the opening of the passivation layer 150. The under-bump metal layer 160 may be formed at the opening of the passivation layer 150 by a known metallization method using a known conductive material, for example, metal, but is not limited thereto.

The electrical connection structure 170 may be a structure for physically and/or electrically connecting the semiconductor package module 100A externally. For example, the semiconductor package module 100A may be mounted on the main board of the electronic device through the electrical connection structure 170. The electrical connection structure 170 may be composed of a low melting point metal, for example, tin (Sn), or an alloy including tin (Sn). More specifically, it may be formed of a solder or the like, but this may be merely an exemplary embodiment, and the material is not particularly limited thereto. The electrical connection structure 170 may be a land, a ball, a pin, or the like. The electrical connection structure 170 may be formed of multiple layers or a single layer. In a case of being formed of multiple layers, it may include a copper pillar and a solder. In a case of being formed of a single layer, tin-silver solder or copper may be included, but this may be merely an example and is not limited thereto. The number, interval, arrangement type, etc., of the electrical connection structures 170 are not particularly limited, and may be sufficiently modified, depending on a design specification by a typical engineer. For example, the number of electrical connection structures 170 may be in the range of tens to thousands, depending on the number of connection pads 122, and may be more or less than the above range.

At least one of the electrical connection structures 170 may be disposed in a fan-out area. The fan-out area may be an area, except for those in which the semiconductor chip 120 is disposed. The fan-out package may be more reliable than the fan-in package, may have many I/O terminals, and may facilitate 3D interconnection. In addition, a package thinner than a ball grid array BGA package, a land grid array LGA package, and the like, may be manufactured, and may be excellent in price competitiveness.

Meanwhile, a cover layer 180 covering the backside metal layer 135 may be further disposed on the first encapsulant 131 and/or the second encapsulant 132 to protect the backside metal layer 135. The cover layer 180 may include an insulating resin and an inorganic filler 150f, but may not include glass fibers. For example, the cover layer 180 may be, but is not limited to, ABF. The passivation layers 150 and 180 stacked on/under the layers may include the same material to control the coefficient of thermal expansion CTE due to the symmetry effect.

Figure 11:
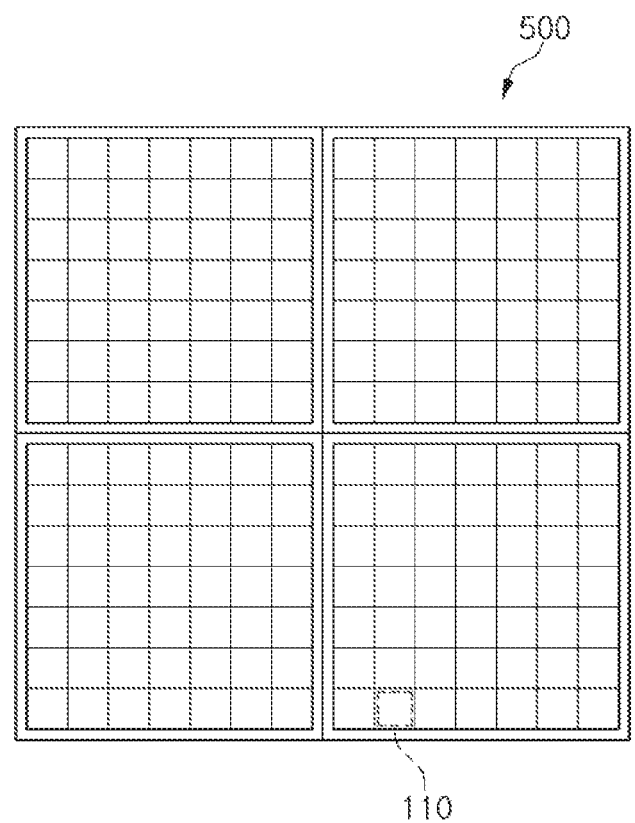
FIG. 11 is a cross-sectional view schematically illustrating an exemplary embodiment of a panel used in a semiconductor package of FIG. 9.

FIG. 11 is a cross-sectional view schematically illustrating an exemplary embodiment of a panel used in a semiconductor package of FIG. 9.

Referring to the drawings, a semiconductor package 100A according to an exemplary embodiment may be manufactured using a panel 500 having a relatively larger size. The size of the panel 500 may be 2 to 4 times larger than the size of a conventional wafer, and thus, a larger number of semiconductor packages 100A may be manufactured through a single process. For example, the productivity may be greatly increased. In particular, the larger the size of each package module 100A, the higher the productivity relative to the case of using the wafer. Each unit portion of the panel 500 may be a core member 110 that is first prepared in the manufacturing method described below. After a plurality of semiconductor packages 100A are simultaneously manufactured by using the panel 500 in a single process, they may be cut by a known cutting process such as a dicing process, or the like, to obtain respective semiconductor packages 100A.

FIGS. 12A to 12E are schematic flow charts illustrating an exemplary method of manufacturing a semiconductor package of FIG. 9.

Figure 12A:
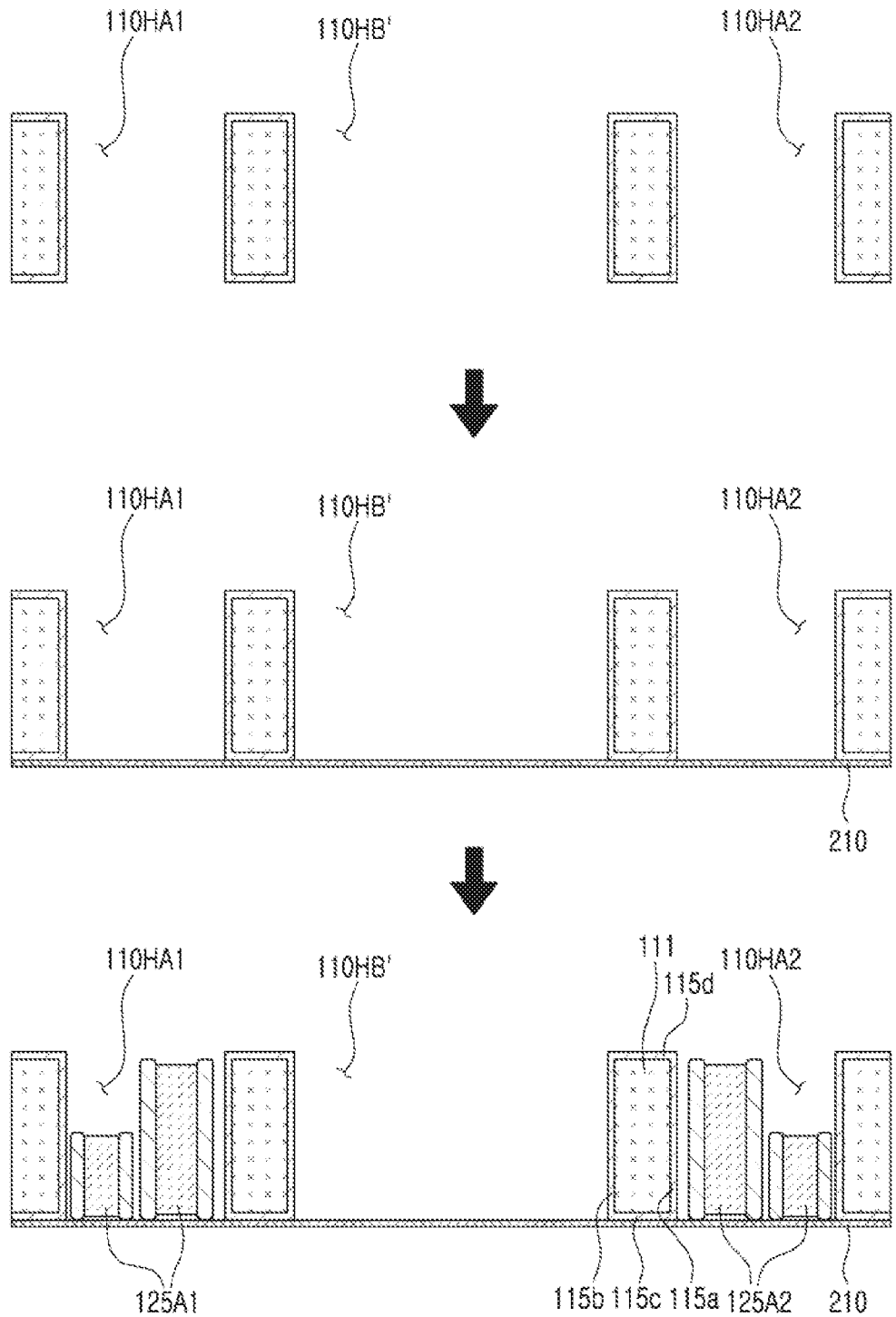
FIGS. 12A to 12E are schematic flow charts illustrating an exemplary method of manufacturing a semiconductor package of FIG. 9.

Referring to FIG. 12A, a core member 110 may first be prepared. The core member 110 may be formed by using the panel 500 described above to prepare a copper clad laminate CCL, and forming a metal layer 115a, 115b, 115c, and 115d by a known plating process such as SAP or MSAP using a copper foil of the copper clad laminate CCL. For example, the metal layers 115a, 115b, 115c, and 115d may be comprised of a seed layer, and a conductor layer thicker than the seed layer, respectively. First through-holes 110HA1 and 110HA2 and a preliminary second through-hole 110HB' may be formed in the core member 110 by using a laser drilling and/or a mechanical drilling or sand blasting, or the like, depending on a material of a core insulation layer 111. A first adhesive film 210 may be attached to a position lower than a position of the core member 110, and passive components 125A1 and 125A2 may be arranged in the first through-holes 110HA1 and 110HA2, respectively. The first adhesive film 210 may be a known tape, but is not limited thereto.

Figure 12B:
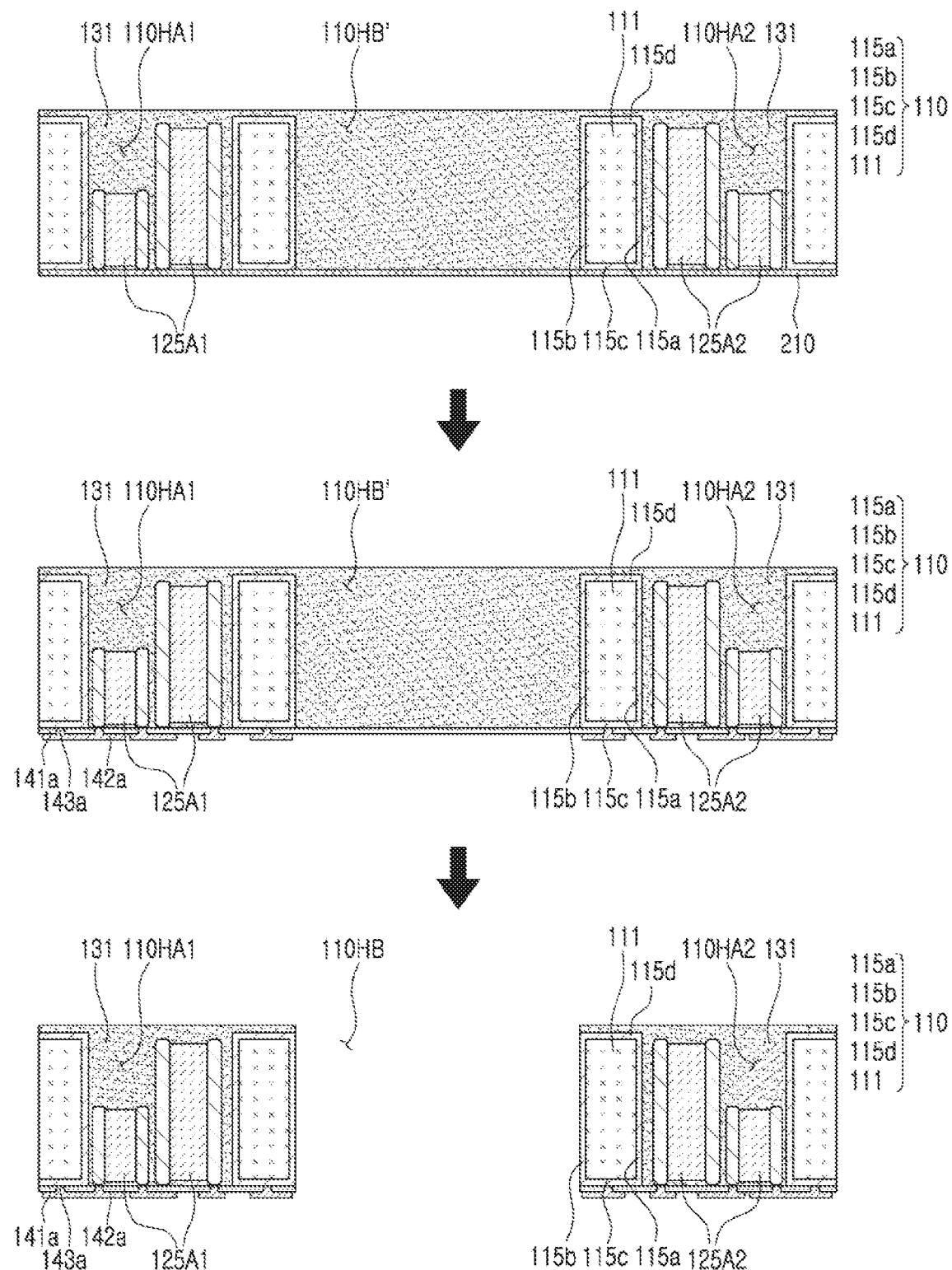

Referring to FIG. 12B, the core member 110 and the passive components 125A1 and 125A2 may be encapsulated by using a first encapsulant 131. The first encapsulant 131 may be formed by a method of laminating a film in an uncured state and then curing the laminated film, or may be formed by applying a liquid material and then curing the liquid material. The first adhesive film 210 may be removed. As a method of peeling the first adhesive film 210 off, a mechanical method may be used. Thereafter, on the removed portion of the first adhesive film 210, a first insulation layer 141a may be formed using an ABF lamination method or the like, a via hole may be formed by a laser-via process, and then a first wiring layer 142a and a first connection via 143a may be formed by a known plating process such as SAP or MSAP. For example, the first wiring layer 142a and the first connection via 143a may be composed of a seed layer, and a conductor layer thicker than the seed layer, respectively. Next, a second through-hole 110HB passing through the first encapsulant 131 and the first insulation layer 141a may be formed using a laser drilling and/or a mechanical drilling or sand blasting, or the like. At this time, a side surface of the second metal layer 115b may be substantially coplanar with a wall surface in which the second through-hole 110HB of the first encapsulant 131 is formed.

Figure 12C:
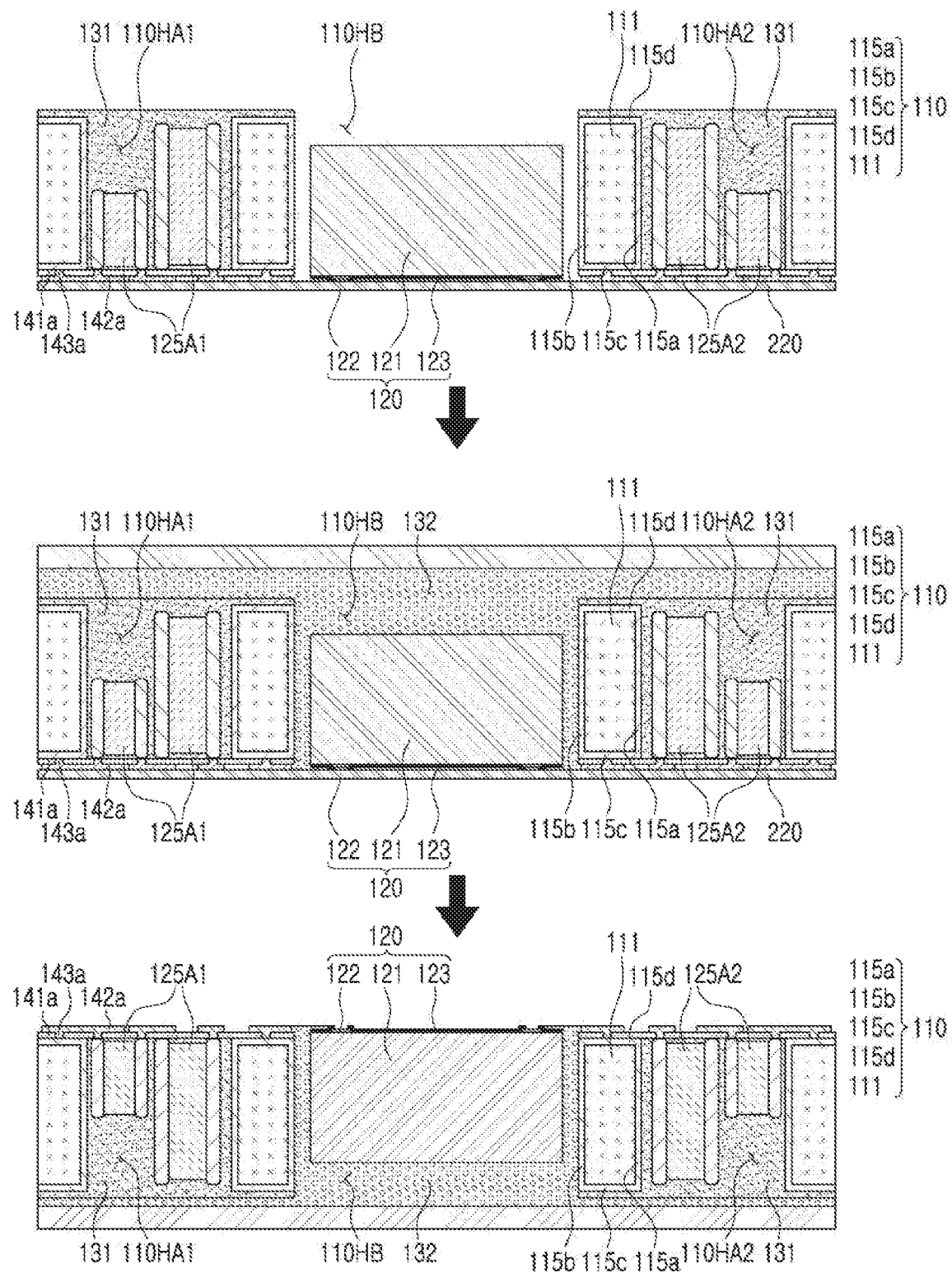

Referring to FIG. 12C, a second adhesive film 220 may be attached to a position lower than a position of the first insulation layer 141a, and semiconductor chip 120 may be attached in a face-down manner on the second adhesive film 220 exposed through the second through-hole 110HB. The first encapsulant 131 and the semiconductor chip 120 may be encapsulated with a second encapsulant 132. Similarly, the second encapsulant 132 may be formed by a method of laminating a film in an uncured state and then curing the laminated film, or may be formed by applying a liquid material and then curing the liquid material. A carrier film 230 may be attached on the second encapsulant 132. In some cases, the second encapsulant 132 may be formed and then laminated on the carrier film 230. The unfinished module manufactured in an upside-down form may be turned over, and the second adhesive film 220 may be separated and removed by a mechanical method or the like.

Figure 12D:
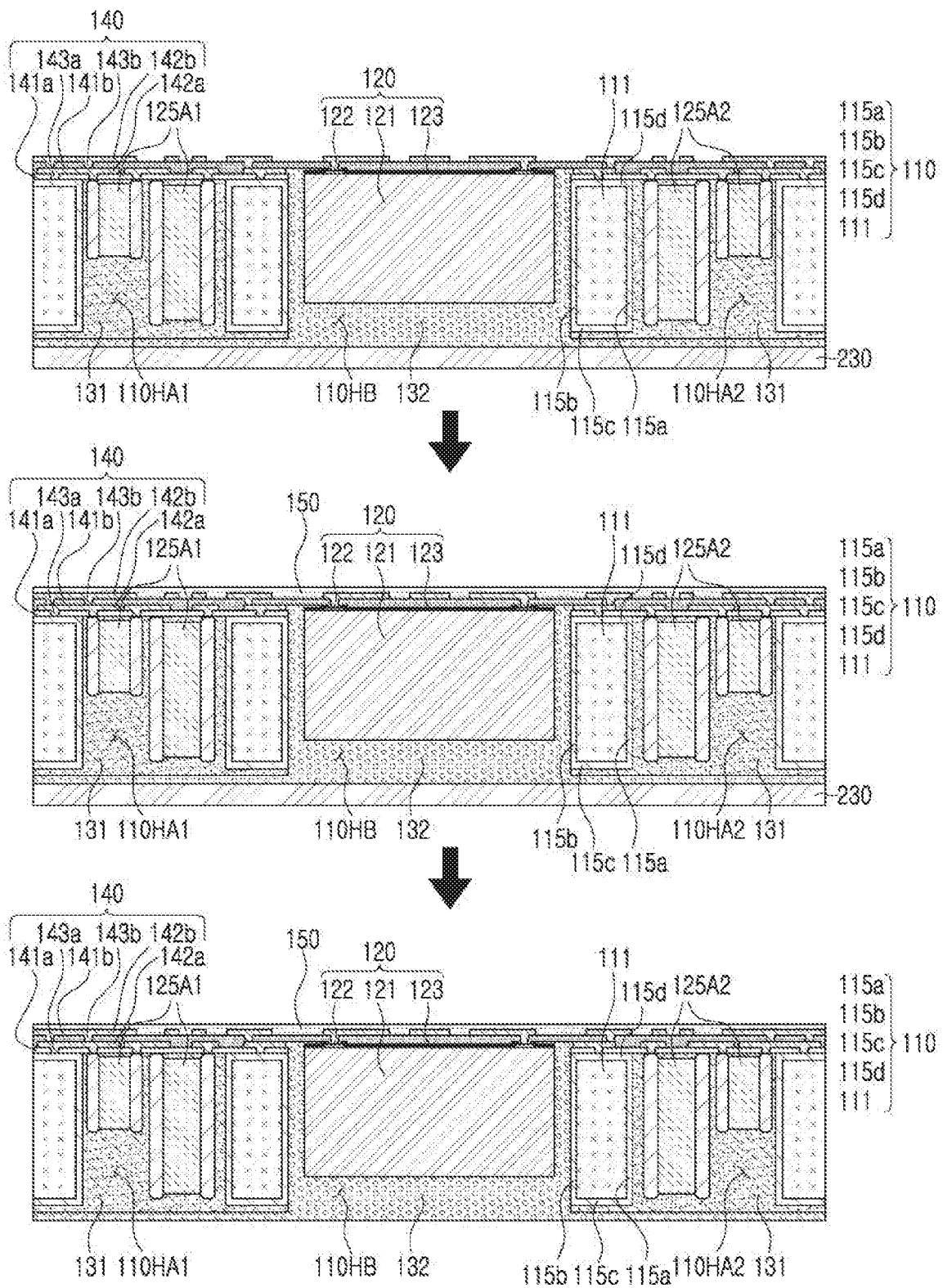

Referring to FIG. 12D, a second insulation layer 141b may be formed on the first insulation layer 141a and an active surface of the semiconductor chip 120 by lamination of a photo-imageable dielectric material PID, and a via hole may be formed with a photo-via process. Similarly, a second wiring layer 142b and a second connection via 143b may be formed by a known plating process to form a connection structure 140. The second wiring layer 142b and the second connection via 143b may also be composed of a seed layer and a conductor layer. A passivation layer 150 may be formed on the connection structure 140 by a known lamination method or a coating method. The carrier film 230 may be separated and removed.

Figure 12E:
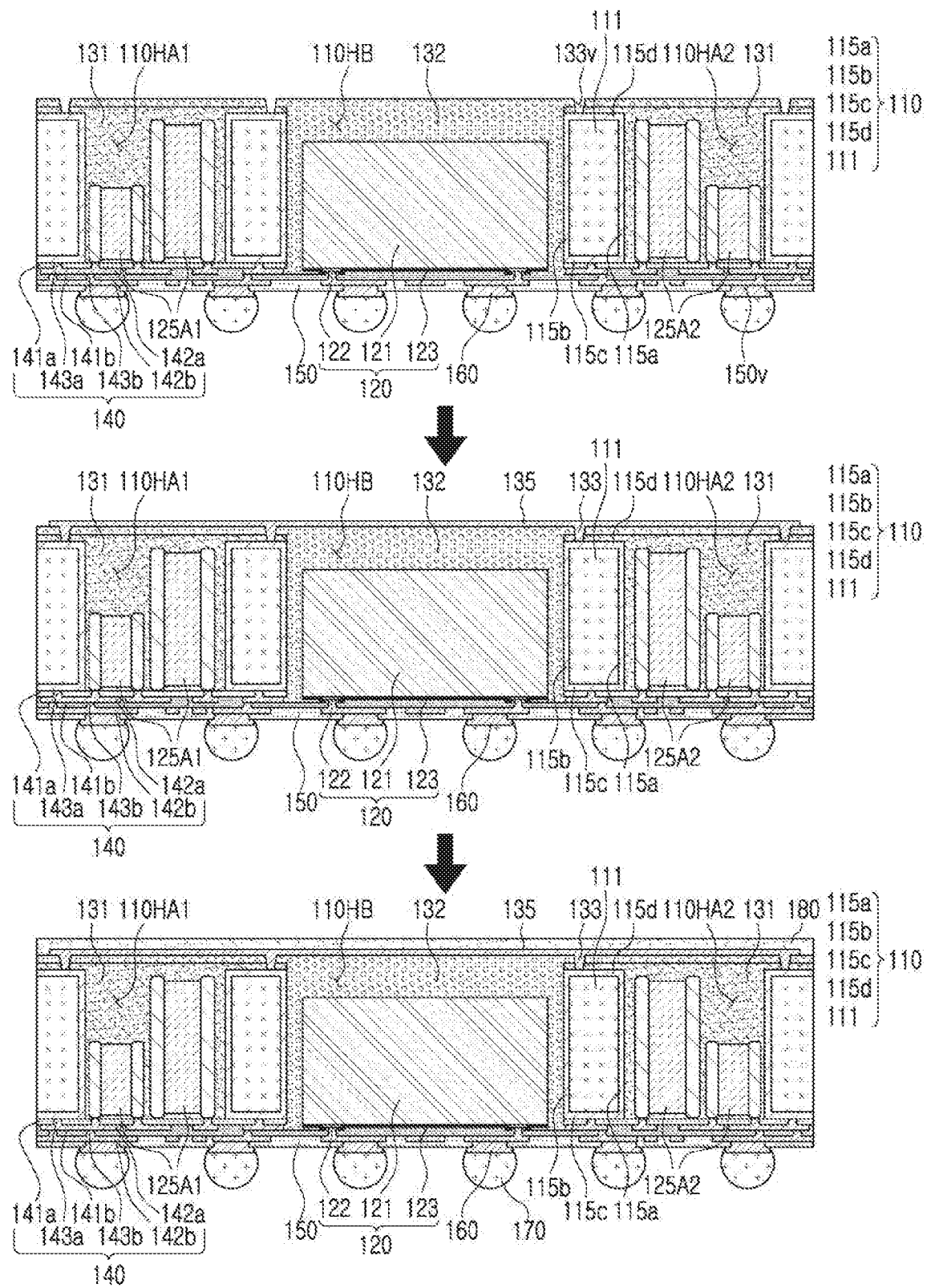

Referring to FIG. 12E, a via hole 133v passing through the first encapsulant 131 and the second encapsulant 132 may be formed using a laser drilling or the like. An opening 150v exposing at least a portion of the second wiring layer 142b of the connection structure 140 may be formed in the passivation layer 150 by using laser drilling or the like. A backside metal via 133 and a backside metal layer 135 may be formed by a known plating process. These may also be composed of a seed layer and a conductor layer. Further, an under-bump metal layer 160 may be formed by a plating process. The under-bump metal layer 160 may also be composed of a seed layer and a conductor layer. When a cover layer 180 is formed on the second encapsulant 132, and an electrical connection structure 170 is formed on the under-bump metal layer 160, the semiconductor package 100A according to the above described exemplary embodiment may be prepared.

When the panel 500 of FIG. 11 or the like is used, a plurality of semiconductor packages 100A may be manufactured through a single process including a series of operations. Thereafter, each semiconductor package 100A may be obtained through a dicing process or the like.

Figure 13:
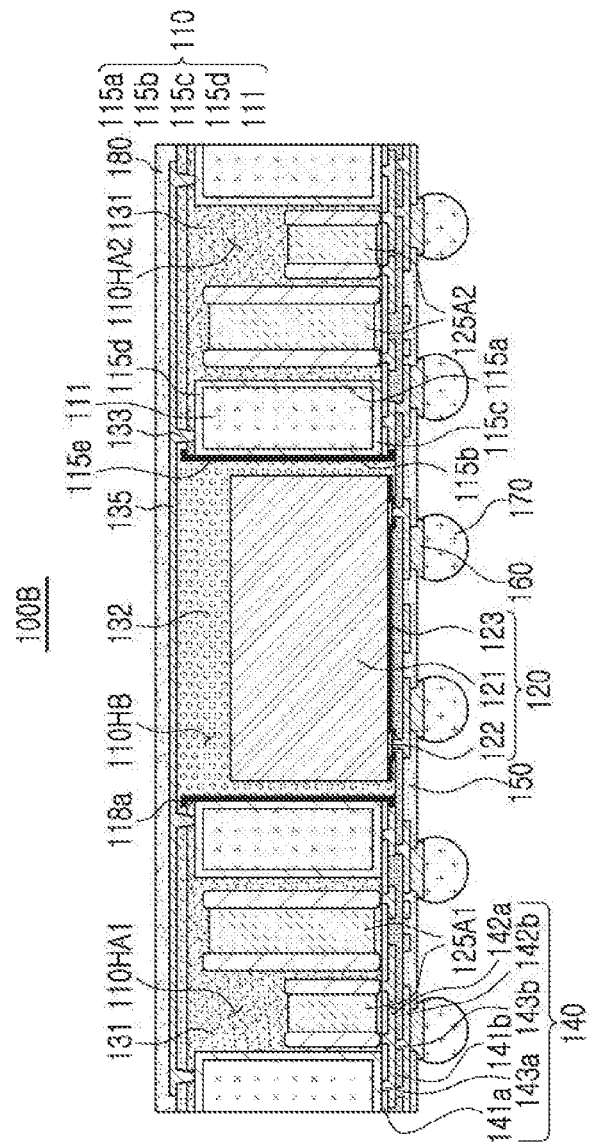
FIG. 13 is a cross-sectional view schematically illustrating another example of a semiconductor package.

FIG. 13 is a cross-sectional view schematically illustrating another example of a semiconductor package.

Referring to the drawings, in a semiconductor package 100B according to another exemplary embodiment, a fifth metal layer 115e surrounding a semiconductor chip 120 may be further disposed on a side surface of the second metal layer 115b, and a wall surface on which the second through-hole 110HB of the first encapsulant 131 is formed. As a result, the plurality of metal layers 115b and 115e are arranged on inner walls of the second through-hole 110HB. The fifth metal layer 115e may be introduced for the EMI shielding effect and the heat dissipation effect of the semiconductor chip 120. The fifth metal layer 115e may also include conductive materials, such as copper (Cu), aluminum (Al), silver (Ag), tin (Sn), gold (Au), nickel (Ni), lead (Pb), titanium (Ti), or an alloy thereof. The fifth metal layer 115e may be formed using a known plating process, and may be composed of a seed layer and a conductor layer. The fifth metal layer 115e may also be used as a ground. In this case, the fifth metal layer 115e may be electrically connected to the ground in the wiring layers 142a and 142b of the connection structure 140. Other configurations and manufacturing methods are substantially the same as those described above, and a detailed description thereof will be omitted.

Figure 14:
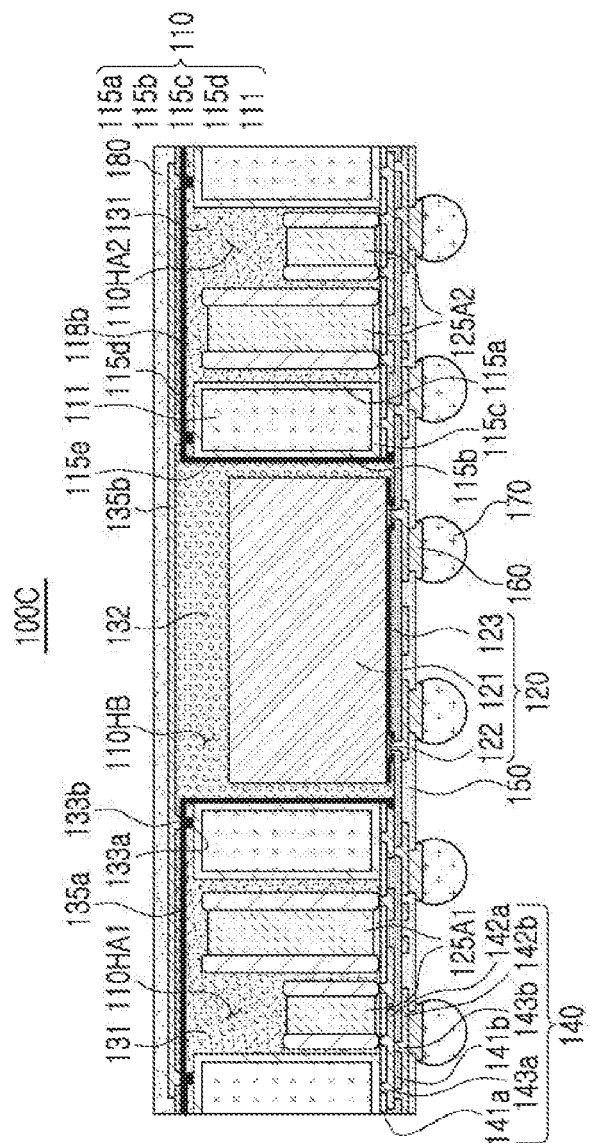
FIG. 14 is a cross-sectional view schematically illustrating another example of a semiconductor package.

FIG. 14 is a cross-sectional view schematically illustrating another example of a semiconductor package.

Referring to the drawings, in a semiconductor package 100C according to another exemplary embodiment, a fifth metal layer 115e surrounding a semiconductor chip 120 may be further disposed on a side surface of the second metal layer 115b, and a wall surface on which the second through-hole 110HB of the first encapsulant 131 is formed, a first backside metal layer 135a may further be disposed on the first encapsulant 131 to cover the passive components 125A1 and 125A2, and first backside metal layer 135a may be connected to a fourth metal layer 115d through the first backside metal via 133a passing through the first encapsulant 131. The second backside metal layer 135b may be disposed on the second encapsulant 132 to cover at least the semiconductor chip 120, and the second backside metal layer 135b may be connected to the first backside metal layer 135a through the second backside metal via 133b passing through the second encapsulant 132. The EMI shielding and heat dissipation of the semiconductor chip 120 and/or the passive components 125A1 and 125A2 may be achieved through the first and second backside metal layers 135a and 135b and the first and second backside metal vias 133a and 133b. They may also include conductive materials, such as copper (Cu), aluminum (Al), silver (Ag), tin (Sn), gold (Au), nickel (Ni), lead (Pb), titanium (Ti), or an alloy thereof. These may also be formed by a known plating process, and each may be composed of a seed layer and a conductor layer. They may also be used as a ground, or may be electrically connected to the ground in the wiring layers 142a and 142b of the connection structure 140 through the first to fifth metal layers 115a, 115b, 115c, 115d, and 115e, or the like. Other configurations and manufacturing methods are substantially the same as those described above.

Figure 15:
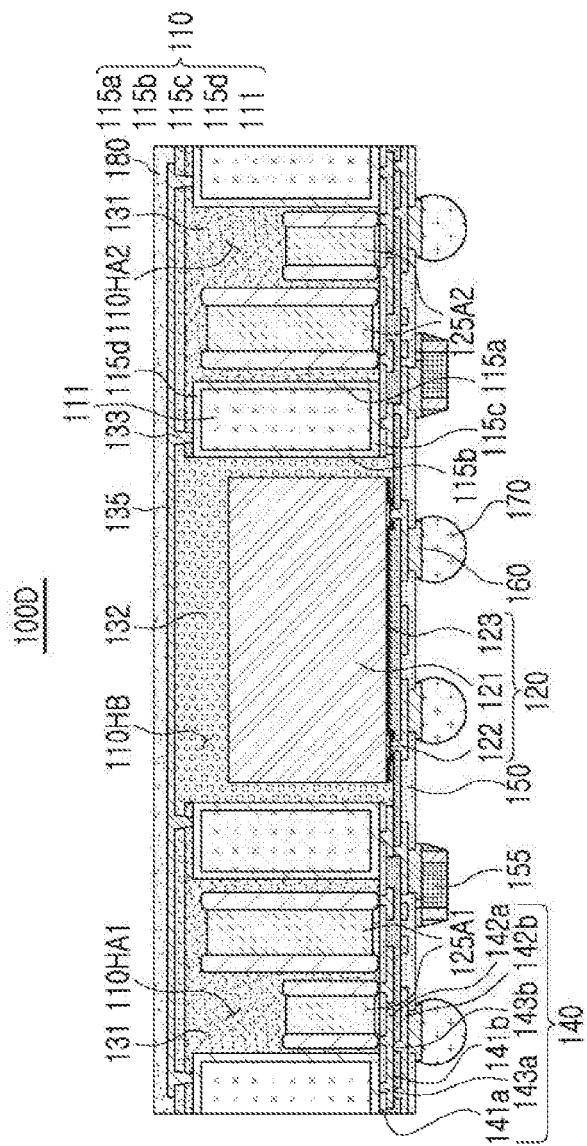
FIG. 15 is a cross-sectional view schematically illustrating another example of a semiconductor package.

FIG. 15 is a cross-sectional view schematically illustrating another example of a semiconductor package.

Referring to the drawings, in a semiconductor package 100D according to another exemplary embodiment, surface mount components 155 may be further arranged on a lower surface of the passivation layer 150. The surface mount components 155 may be capacitors, inductors, beads, or the like. For example, the surface mount component 155 may be a land side capacitor LSC, but is not limited thereto, and may be an active component, for example, a die in a form of an integrated circuit IC. The surface mount components 155 may be electrically connected to the connection pad 122 and/or the passive components 125A1 and 125A2 of the semiconductor chip 120 through the wiring layers 142a and 142b and the connection vias 143a and 143b of the connection structure 140. Other configurations and manufacturing methods are substantially the same as those described above, and a detailed description thereof will be omitted.

Figure 16:
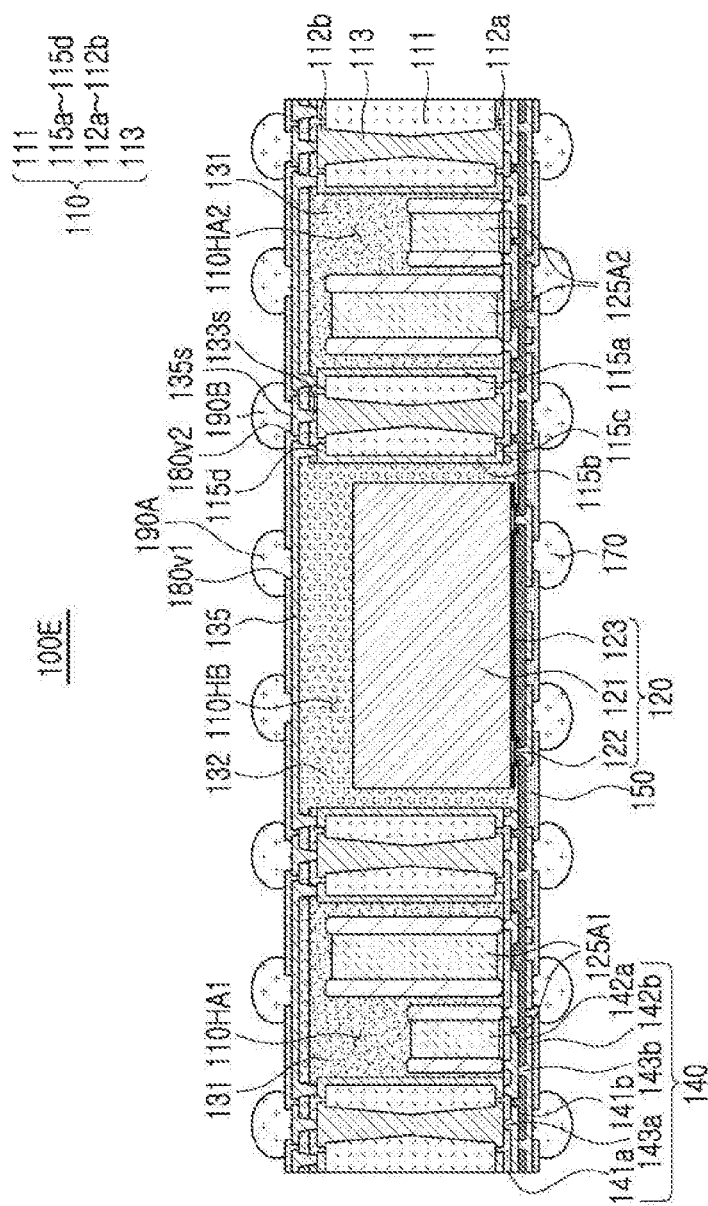
FIG. 16 is a cross-sectional view schematically illustrating another example of a semiconductor package.

FIG. 16 is a cross-sectional view schematically illustrating another example of a semiconductor package.

Referring to the drawings, a semiconductor package 100E according to another exemplary embodiment may further include a wiring via 113 in which a core member 110 passes through the first and second wiring layers 112a and 112b and the core insulation layer 111, which are arranged on the lower and upper surfaces of the core insulation layer 111, respectively, and electrically connecting the first and second wiring layers 112a and 112b. The first and second wiring layers 112a and 112b may be electrically connected to the connection pads 122 and/or the passive components 122a of the semiconductor chip 120 through the wiring layers 142a and 142b and the connection vias 143a and 143b of the connection structure 140. The semiconductor package 100E may have a vertical electrical connection path through the core member 110, and may be introduced into a package-on-package structure.

The wiring layers 112a and 112b may serve to redistribute the connection pads 122 of the semiconductor chip 120. As the material for forming the wiring layers 112a and 112b, conductive materials, such as copper (Cu), aluminum (Al), silver (Ag), tin (Sn), gold (Au), nickel (Ni), lead (Pb), titanium (Ti), or alloys thereof may be used. The wiring layers 112a and 112b may perform various functions, depending on a desired design of the layer of interest. For example, it may include a ground (GND) pattern, a power (PWR) pattern, a signal (S) pattern, and the like. In this case, the signal pattern may include various signals except for a ground pattern, a power pattern, and the like, for example, a data signal and the like. Also, a via pad, a wire pad, an electrical connection structure pad, and the like may be included. The wiring layers 112a and 112b may be formed by a known plating process, and may be composed of a seed layer and a conductor layer, respectively. The thickness of the wiring layers 112a and 112b may be thicker than the thickness of the wiring layers 142a and 142b.

The material of the core insulation layer 111 is not particularly limited. For example, an insulating material may be used. As the insulating material, a thermosetting resin such as an epoxy resin, a thermoplastic resin such as polyimide, or a mixture of these resins with an inorganic filler, or a resin in which the above resins are impregnated with an inorganic filler such as silica into a core material, such as a glass fiber, a glass cloth, or a glass fabric, for example, a prepreg may be used.

The wiring vias 113 may electrically connect the wiring layers 112a and 112b formed in different layers to each other to form an electrical path in the core member 110. The wiring vias 113 may also be formed of a conductive material. The wiring vias 113 may be entirely filled with a conductive material, or a conductive material may be formed along the wall surface of holes of the vias. It may also have an hourglass shape. The wiring vias 113 may also be formed by a known plating process, and may be composed of a seed layer and a conductor layer, respectively.

In a semiconductor package 100E according to another exemplary embodiment, a backside wiring layer 135s in addition to the backside metal layer 135 may be further provided on the second encapsulant 132. The backside wiring layer 135s may be connected to the second wiring layer 112b of the core member 110 through a backside wiring via 133s passing through the first encapsulant 131 and the second encapsulant 132. Openings 180v1 and 180v2 for exposing at least a portion of each of the backside metal layer 135 and the backside wiring layer 135s may be formed in the cover layer 180. The electrical connection structures 190A and 190B may be arranged on the openings 180v1 and 180v2 and may be connected to the backside metal layer 135 and the backside wiring layer 135s exposed through the above, respectively.

The backside metal layer 135 and the backside metal via 133 may be formed for the purpose of EMI shielding and heat dissipation as described above. In this case, when the backside metal layer 135 and the backside metal via 133 are connected to a printed circuit board such as a main board through the electrical connection structure 190A, the EMI shielding and heat dissipation effects may be further improved. The backside metal layer 135 and the backside metal via 133 may be used as a ground as described above, and may electrically connected to the ground of the wiring layer 142a and 142b of the connection structure 140 through the metal layers 115a, 115b, 115c, and 115d of the core member 110.

The backside wiring layer 135s and the backside wiring via 133s may be electrically connected to the semiconductor chip 120 and/or the passive components 125A1 and 125A2 through the wiring layers 112a and 112b of the core member 110, the wiring via 113, the wiring layers 142a and 142b of the connection structure 140, and the connection vias 143a and 143b. For example, the backside wiring layer 135s and the backside wiring via 133s may have a main purpose for signal connection. The backside wiring layer 135s may be connected to a printed circuit board such as a main board through the electrical connection structure 190B, to provide an electrical path between the semiconductor package 100E and the printed circuit board. In this case, in the semiconductor package 100E, a back side thereof may be mounted on the printed circuit board, and a front side thereof may be connected to an antenna substrate or the like through the electrical connection structure 170 in a package-on-package manner. For example, the semiconductor package 100B according to another exemplary embodiment may be easily applied to various types of module structures in a package-on-package manner. The backside wiring layer 135s and the backside wiring via 133s may also include conductive materials, such as copper (Cu), aluminum (Al), silver (Ag), tin (Sn), gold (Au), nickel (Ni), lead (Pb), titanium (Ti), or an alloy thereof.

The backside metal layer 135 may cover the majority of an upper surface of the second encapsulant 132, and may not cover a space in which the backside wiring layer 135s is formed. At this time, the backside metal layer 135 and the backside wiring layer 135s may be physically spaced apart from each other in a predetermined distance. For example, the backside wiring layer 135s may be disposed in the form of an island with respect to the backside metal layer 135.

The electrical connection structures 190A and 190B may each be composed of a low melting point metal, for example, tin (Sn), or an alloy including tin (Sn). More specifically, it may be formed of a solder or the like, but this may be merely an example, and the material thereof is not particularly limited thereto. The electrical connection structures 190A and 190B may be a land, a ball, a pin, or the like, respectively. The electrical connection structures 190A and 190B may be formed of multiple layers or a single layer, respectively. In a case of being formed of multiple layers, it may include a copper pillar and a solder. In a case of being formed of a single layer, tin-silver solder or copper may be included, but this may merely be an example and is not limited thereto. The electrical connection structure 190A may be connected to the backside metal layer 135, and the electrical connection structure 190B may be connected to the backside wiring layer 135s.

Figure 17:
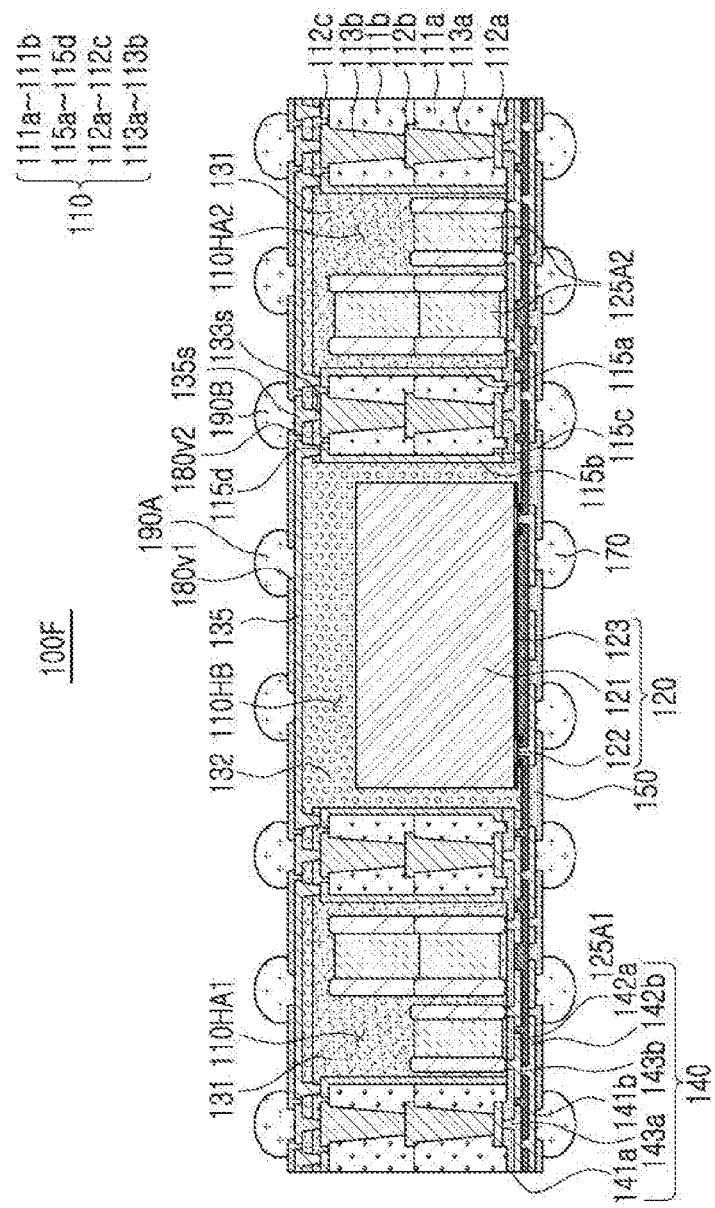
FIG. 17 is a cross-sectional view schematically illustrating another example of a semiconductor package.

FIG. 17 is a cross-sectional view schematically illustrating another example of a semiconductor package.

Referring to the drawings, a semiconductor package 100F according to another exemplary embodiment may include a first core insulation layer 111a in which a core member 110 contacts a connection structure 140, a first wiring layer 112a in contact with the connection structure 140 and embedded in the first core insulation layer 111a, a second wiring layer 112b disposed opposing a side in which the first wiring layer 112a of the first core insulation layer 111a is embedded, a second core insulation layer 111b disposed on the first core insulation layer 111a and covering at least a portion of the second wiring layer 112b, and a third wiring layer 112c disposed on the second core insulation layer 111b, in a semiconductor package 100E according to another example described above. The first to third wiring layers 112a, 112b, and 112c may be electrically connected to the connection pad 122. The first and second wiring layers 112a and 112b and the second and third wiring layers 112b and 112c may be electrically connected to the first and second wiring vias 113a and 113b passing through the first and second core insulation layers 111a and 111b, respectively.

The first wiring layer 112a may be recessed into the first core insulation layer 111a. In this way, when the first wiring layer 112a is recessed into the first core insulation layer 111a to have a step difference between a lower surface of the first core insulation layer 111a and a lower surface of the first wiring layer 112a, the material for forming the encapsulant 131 may be prevented from being bleeding to contaminate the first wiring layer 112a. The wiring layers 112a, 112b, and 112c of the core member 110 may be thicker than the wiring layers 142a and 142b of the connection structure 140.

The material of the core insulation layers 111a and 111b is not particularly limited. For example, an insulating material may be used. As the insulating material, a thermosetting resin such as an epoxy resin, a thermoplastic resin such as polyimide, or a resin in which the above resins are mixed with an inorganic filler, for example, ABF (Ajinomoto Build-up Film) may be used. A photo-imageable dielectric resin, for example, a photo-imageable dielectric PID resin may be used.

A portion of the pads of the first wiring layer 112a may serve as a stopper, when a hole for the first wiring via 113a is formed. The width of the upper surface of the first wiring via 113a may have a tapered shape wider than the width of the lower surface thereof in terms of the process. In this case, the first wiring via 113a may be integrated with the pad pattern of the second wiring layer 112b. When a hole for the second wiring via 113b is formed, a portion of the pads of the second wiring layer 112b may serve as stoppers. The width of the upper surface of the second wiring via 113b may have a tapered shape wider than the width of the lower surface thereof in terms of the process. In this case, the second wiring via 113b may be integrated with the pad pattern of the third wiring layer 112c.

Meanwhile, the described core member 110 of the semiconductor package 100E may be applied to the various semiconductor packages 100A, 100B, 100C, and 100D as described above. Other configurations are substantially the same as those described above, and a detailed description thereof will be omitted.

Figure 18:
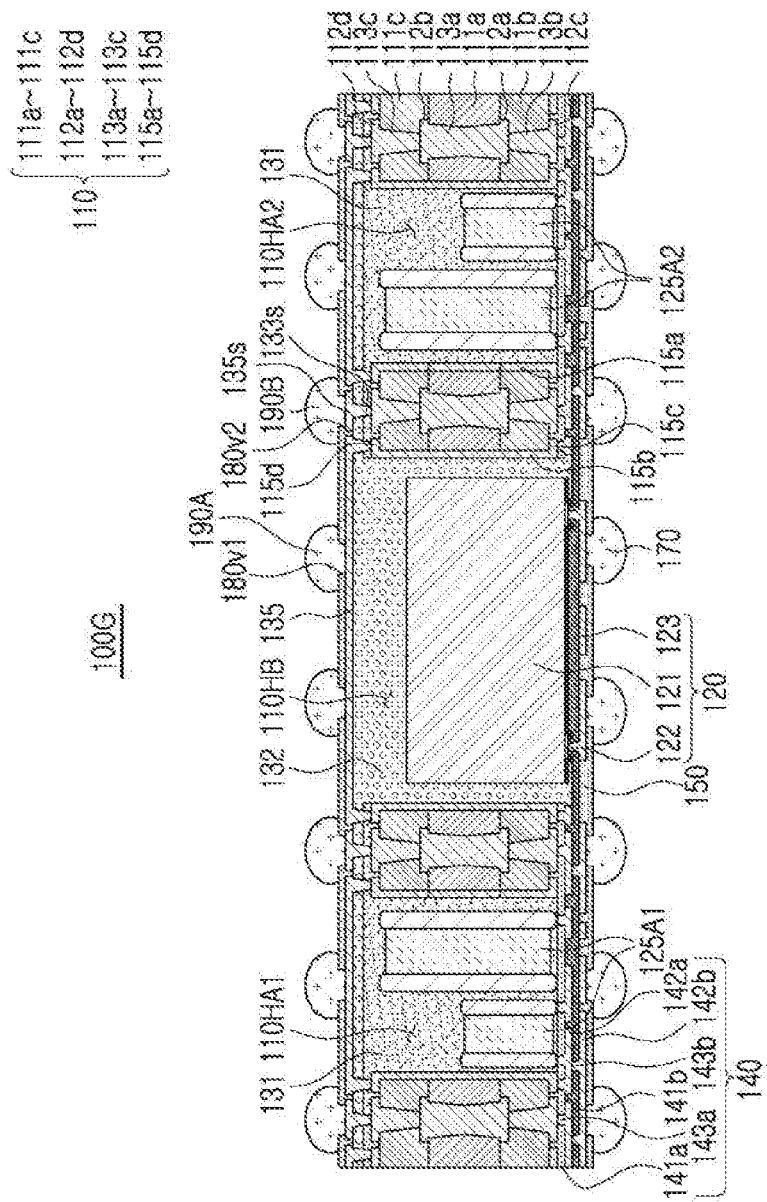
FIG. 18 is a cross-sectional view schematically illustrating another example of a semiconductor package.

FIG. 18 is a cross-sectional view schematically illustrating another example of a semiconductor package.

Referring to the drawings, in a semiconductor package 100G according to another exemplary embodiment, the core member 110 may include a first core insulation layer 111a, a first wiring layer 112a and a second wiring layer 112b arranged on a lower surface and an upper surface of the first core insulation layer 111a, respectively, a second core insulation layer 111b disposed on the lower surface of the first core insulation layer 112a and covering at least a portion of the first wiring layer 112a, a wiring layer 111c disposed on the lower surface of the second core insulation layer 111b, a third core insulation layer 111c disposed on the upper surface of the first core insulation layer 111a and covering at least a portion of the second wiring layer 112b, and a fourth wiring layer 112d disposed on the upper surface of the third core insulation layer 111c, based on the semiconductor package 100E according to another exemplary embodiment described above. The first to fourth wiring layers 112a, 112b, 112c, and 112d may be electrically connected to a connection pad 122. Since the core member 110 includes a larger number of wiring layers 112a, 112b, 112c, and 112d, the connection structure 140 may be further simplified. Therefore, a yield reduction due to defects generated in the process of forming the connection structure 140 may be improved. The first to fourth wiring layers 112a, 112b, 112c, and 112d may be electrically connected to the first to third wiring vias 113a, 113b, and 113c passing through the first to third core insulation layers 111a, 111b, and 111c, respectively.

The first core insulation layer 111a may be thicker than the second core insulation layer 111b and the third core insulation layer 111c. The first core insulation layer 111a may be relatively thick to maintain rigidity, and the second core insulation layer 111b and the third core insulation layer 111c may be introduced to form a larger number of wiring layers 112c and 112d. The first core insulation layer 111a may include an insulating material different from the second core insulation layer 111b and the third core insulation layer 111c. For example, the first core insulation layer 111a may be, for example, a prepreg including a core material, a filler, and an insulating resin, and the second core insulation layer 111c and the third core insulation layer 111c may be ABF or PID including a filler and an insulating resin, but is not limited thereto. From a similar point of view, the first wiring via 113a passing through the first core insulation layer 111a may be longer in diameter than the second and third wiring vias 113b and 113c passing through the second and third core insulation layers 111b and 111c. Similarly, the wiring layers 112a, 112b, 112c, and 112d of the core member 110 may be thicker than the wiring layers 142a and 142b of the connection structure 140.

Meanwhile, the described core member 110 of the semiconductor package 100F may be applied to the various semiconductor packages 100A, 100B, 100C, and 100D, as described above. Other configurations are substantially the same as those described above, and a detailed description thereof will be omitted.

Figure 19:
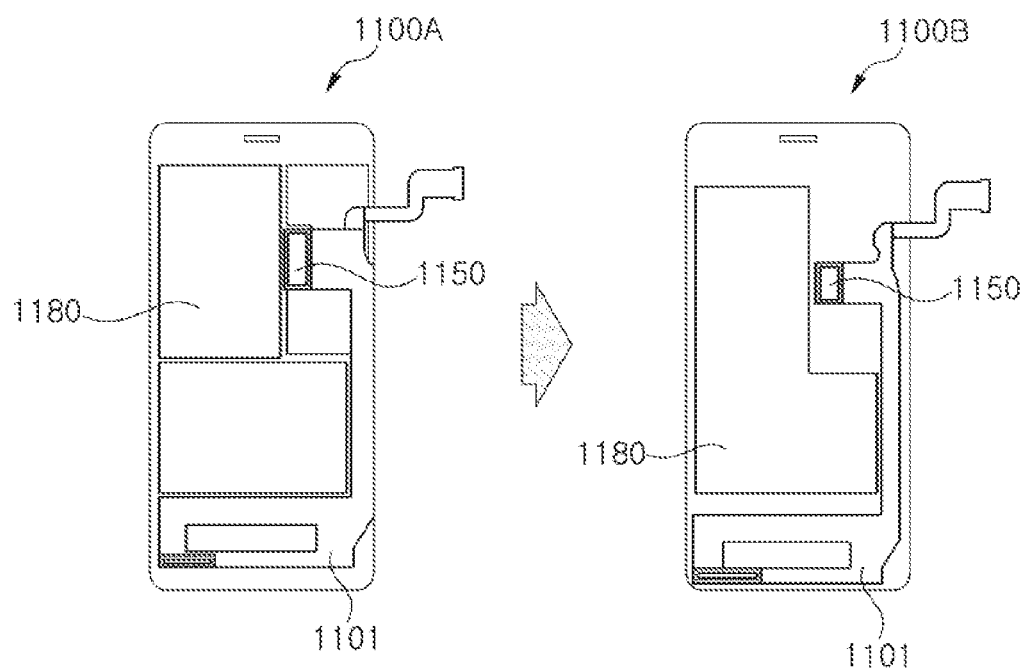
FIG. 19 is a plan view schematically illustrating an effect of implementing a semiconductor package according to the present disclosure in an electronic device.

FIG. 19 is a plan view schematically illustrating an effect of implementing a semiconductor package according to the present disclosure in an electronic device.

Referring to the drawings, as the size of mobile devices displays 1100A and 1100B increase, there has been a need for increasing battery capacity. As the battery capacity increases, the area occupied by the battery 1180 increases. As a result, it may be necessary to reduce the size of the printed circuit board 1101 such as a main board. Therefore, the area occupied by a module 1150 including a PMIC and its accompanying passive components is continuously decreasing. In this case, when the semiconductor packages 100A, 100B, 100C, 100D, 100E, 100F, and 100G according to the present disclosure are applied to the module 1150, the size may be significantly reduced, and the narrowed area may be thus effectively utilized.

In the present disclosure, the words lower, lower portion, lower surface, and the like are used to refer to the downward direction (in the vertical direction of the drawings, which is also referred to as the thickness direction) with respect to the cross section of the drawing for convenience, while the words upper, upper portion, upper surface, and the like are used to refer to a direction opposite thereto. It should be understood that, the definitions refer to directions for convenience of explanation, the scope of the claims is not particularly limited by the description of such directions, and the concepts of the upward/downward directions may be changed at any time.

The term of "connect" or "connection" in the present disclosure may be not only a direct connection, but also a concept including an indirect connection through an adhesive layer or the like. In addition, the term "electrically connected" or "electrical connection" means a concept including both a physical connection and a physical non-connection. Also, the expressions of "first," "second," etc. are used to distinguish one component from another, and do not limit the order and/or importance of the components. In some cases, without departing from the spirit of the invention, the first component may be referred to as a second component, and similarly, the second component may be referred to as a first component.

The uses of the expression "an exemplary embodiment" used in the present disclosure do not all refer to the same embodiment, but may be provided for emphasizing and explaining different unique features. However, the above-mentioned exemplary embodiments do not exclude that they are implemented in combination with the features of other exemplary embodiments. For example, although the description in the specific exemplary embodiment may be not described in another exemplary embodiment, it may be understood as an explanation related to another exemplary embodiment, unless otherwise described or contradicted by the other exemplary embodiment.

The terms used in the present disclosure are used only to illustrate an exemplary embodiment, and are not intended to limit the present disclosure. At this time, the singular expressions include plural expressions unless the context clearly dictates otherwise.

As one of the effects in a semiconductor package having a novel structure according to an exemplary embodiment of the present disclosure, the mounting area of a semiconductor chip and a passive component may be significantly reduced, the electrical path between the semiconductor chip and the passive component may be significantly reduced, process defects such as undulations and cracks may be significantly reduced, and, furthermore, electrodes of passive components may be easily connected to connection vias by a laser-via hole processor the like.

While exemplary embodiments have been shown and described above, it will be apparent to those skilled in the art that modifications and variations could be made without departing from the scope of the present disclosure as defined by the appended claims.

What is claimed is:

1. A semiconductor package comprising:
a connection structure including a first insulation layer, a second insulation layer lower in a thickness direction than the first insulation layer, first and second wiring layers on lower surfaces of the first and second insulation layers, respectively, and first and second connection vias passing through the first and second insulation layers, respectively;
a core member on the first insulation layer;
a first through-hole passing through the core member, having one or more passive components on the first insulation layer in the first through-hole and connected to the first wiring layer through one or more of the first connection vias, and a first encapsulant covering at least a portion of the passive components and filling at least a portion of the first through-hole;
a second through-hole passing through the core member and the first insulation layer;
a semiconductor chip on the second insulation layer in the second through-hole and connected to the second wiring layer through one or more of the second connection vias; and
a second encapsulant covering at least a portion of the semiconductor chip and filling at least a portion of the second through-hole.

2. The semiconductor package according to claim 1, wherein a first depth of the second through-hole in the thickness direction is larger than a second depth of the first through-hole in the thickness direction.

3. The semiconductor package according to claim 1, wherein a second bottom surface of the second through-hole is lower in the thickness direction than a first bottom surface of the first through-hole.

4. The semiconductor package according to claim 3, wherein the first bottom surface of the first through-hole is at a first upper surface of the first insulation layer, and the second bottom surface of the second through-hole is at an second upper surface of the second insulation layer.

5. The semiconductor package according to claim 1, wherein the semiconductor chip has an active surface on which a connection pad connected to the second connection via is disposed, and an inactive surface opposing the active surface, and a lower surface of the first wiring layer is substantially coplanar with the active surface of the semiconductor chip.

6. The semiconductor package according to claim 1, wherein the first and second insulation layers comprise different materials from each other.

7. The semiconductor package according to claim 6, wherein the first and second insulation layers comprise an inorganic filler and an insulating resin, respectively, and a first weight percentage of the inorganic filler included in the first insulation layer is greater than a second weight percentage of the inorganic filler included in the second insulation layer.

8. The semiconductor package according to claim 6, wherein the first insulation layer has a lower coefficient of thermal expansion (CTE) than the second insulation layer.

9. The semiconductor package according to claim 6, wherein the first insulation layer comprises a non-photo-imageable dielectric material, and the second insulation layer comprises a photo-imageable dielectric material.

10. The semiconductor package according to claim 1, further comprising:
a passivation layer on a lower surface of the connection structure and having an opening exposing at least a portion of the second wiring layer; and
a first electrical connection structure on the opening of the passivation layer and connected to the exposed portion of the second wiring layer.

11. The semiconductor package according to claim 10, further comprising:
one or more surface mount components on a lower surface of the passivation layer and electrically connected to the semiconductor chip via the connection structure.

12. The semiconductor package according to claim 1, wherein the first encapsulant covers an upper portion of the core member, and the second encapsulant covers an upper portion of the first encapsulant.

13. The semiconductor package according to claim 12, wherein the core member comprises a core insulation layer, a first metal layer on a first wall surface of the core insulation layer on which the first through-hole is formed and surrounding the passive component, a second metal layer on a second wall surface of the core insulation layer on which the second through-hole is formed and surrounding the semiconductor chip, and third and fourth metal layers respectively on lower and upper surfaces of the core insulation layer; and
wherein the first and second metal layers are connected to the fourth metal layer.

14. The semiconductor package according to claim 13, further comprising:
a backside metal layer on the second encapsulant and covering the passive component and the inactive surface of the semiconductor chip; and
a backside metal via passing through the first encapsulant and the second encapsulant and connecting the backside metal layer to the fourth metal layer.

15. The semiconductor package according to claim 14, wherein the backside metal via is a trench via having a predetermined length.

16. The semiconductor package according to claim 14, further comprising a cover layer on the second encapsulant and covering the backside metal layer.

17. The semiconductor package according to claim 14, further comprising:
a cover layer on the second encapsulant and having an opening exposing at least a portion of the backside metal layer; and
a second electrical connection structure on the opening of the cover layer and connected to the exposed backside metal layer.

18. The semiconductor package according to claim 13, wherein a side surface of the second metal layer is substantially coplanar with a wall surface of the first encapsulant at the second through-hole, and a fifth metal layer surrounding the semiconductor chip is on the side surface of the second metal layer and the wall surface of the first encapsulant at the second through-hole.

19. The semiconductor package according to claim 18, further comprising:
a first backside metal layer on the first encapsulant, covering the passive component, and connected to the fifth metal layer;
a first backside metal via passing through the first encapsulant and connecting the first backside metal layer to the fourth metal layer;
a second backside metal layer on the second encapsulant and covering at least the semiconductor chip; and
a second backside metal via passing through the second encapsulant and connecting the second backside metal layer to the first backside metal layer.

20. The semiconductor package according to claim 1, wherein the core member comprises a first core insulation layer, first and second wiring layers respectively on a lower surface and an upper surface of the first core insulation layer, and a first wiring via passing through the first core insulation layer and electrically connecting the first and second wiring layers; and
wherein the first and second wiring layers are electrically connected to a connection pad of the semiconductor chip.

21. The semiconductor package according to claim 20, wherein the core member further comprises second and third core insulation layers respectively on the lower and upper surfaces of the first core insulation layer and covering at least a portion of the first and second wiring layers, a third wiring layer on the lower surface of the second core insulation layer, a fourth wiring layer on the upper surface of the third core insulation layer, a second wiring via passing through the second core insulation layer and electrically connecting the first and third wiring layers, and a third wiring via passing through the third core insulation layer and electrically connecting the second and fourth wiring layers; and
wherein the third and fourth wiring layers are electrically connected to the connection pad of the semiconductor chip.

22. The semiconductor package according to claim 1, wherein the core member comprises a first core insulation layer in contact with the connection structure, a first wiring layer in contact with the connection structure and embedded in the first core insulation layer, a second wiring layer opposing a side on which the first wiring layer of the first core insulation layer is embedded, a first wiring via passing through the first core insulation layer and electrically connecting the first and second wiring layers, a second core insulation layer on the first core insulation layer and covering at least a portion of the second wiring layer, a third wiring layer on the second core insulation layer, and a second wiring via passing through the second core insulation layer and electrically connecting the second and third wiring layers; and
the first to third wiring layers are electrically connected to a connection pad of the semiconductor chip.

23. A semiconductor package comprising:
a core member;
a first through-hole passing through the core member;
a second through-hole passing through the core member and spaced apart from the first through-hole;
one or more passive components in the first through-hole;
a semiconductor chip in the second through-hole, and having an active surface with a connection pad and an inactive surface opposing the active surface;
an encapsulant covering at least a portion of each of the passive component and the inactive surface of the semiconductor chip, and filling at least a portion of each of the first through-hole and the second through-hole; and
a connection structure on the passive component and the active surface of the semiconductor chip, and including at least one wiring layer electrically connected to the passive component and the connection pad of the semiconductor chip, and
wherein a first bottom surface of the second through-hole has a step difference from a second bottom surface of the first through-hole.

24. The semiconductor package according to claim 23, wherein the passive component and the connection pad of the semiconductor chip are connected to wiring layers on different levels in the wiring layer of the connection structure through the connection via, respectively.

25. A semiconductor package comprising:
a core member having one or more first through-holes and at least one second through-hole;
a first insulation layer below the one or more first through-holes;
one or more passive components on the first insulation layer in the one or more first through-holes;
a second insulation layer below the first insulation layer and below the second through-hole;
a semiconductor chip on the second insulation layer in the at least one second through-hole.

26. The semiconductor package of claim 25, further comprising:
a first encapsulant, in contact with the first insulation layer, covering at least a portion of the one or more passive components, and covering at least a portion of an upper surface of the core member; and
a second encapsulant, in contact with the second insulating layer, covering at least a portion of the semiconductor chip, and covering at least a portion of the first encapsulant.

27. The semiconductor package of claim 25, wherein:
the first insulation layer comprises a non-photo-imageable dielectric material; and
the second insulation layer comprises a photo-imageable dielectric material.

28. The semiconductor package of claim 25, further comprising:
a side metal layer on a side surface of the at least one second through-hole containing the semiconductor chip and between the semiconductor chip and at least one of the one or more passive components; and
an upper metal layer connected to the side metal layer, over at least a portion of the core member, and over at least a portion of the at least one of the one or more passive components.

29. A method of manufacturing a semiconductor package comprising:
obtaining a core member with a first through-hole and a second through-hole;
disposing one or more passive components in the first through-hole;
forming a first insulation layer on the one or more passive components and on at least a portion of the core member;
disposing a semiconductor chip in the second through-hole; and
forming a second insulation layer on the semiconductor chip and on the first insulation layer.

30. The method of claim 29, further comprising:
after forming the first insulation layer and before forming the second insulation layer, forming one or more first conductive vias passing through the first insulation layer and connecting to the one or more passive components, and one or more first conductive layers on the first insulation layer and connected to the one or more first conductive vias; and
after forming the second insulation layer, forming one or more second conductive vias passing through the second insulation layer, including one or more second conductive vias connecting to the one or more first conductive layers and one or more second conductive vias connecting to the semiconductor chip, and one or more second conductive layers on the second insulation layer and connected to the one or more second conductive vias.

31. The method of claim 30, further comprising:
before forming the first insulation layer, covering the one or more passive components and at least a portion of the core member with a first encapsulant; and
before forming the second insulation layer, covering the semiconductor chip and at least a portion of the first encapsulant with a second encapsulant.

32. The method of claim 31, further comprising:
forming one or more third conductive vias passing through the first and second encapsulants and connecting to respective portions of the core member, and one or more third conductive layers on the second encapsulant,
wherein the core member includes one or more metal layers that electrically connect first conductive vias to third conductive vias.

* * * * *